US009244213B2

United States Patent
Itoh et al.

(10) Patent No.: US 9,244,213 B2
(45) Date of Patent: Jan. 26, 2016

(54) EDGE-LIGHT TYPE PLANAR LIGHT SOURCE DEVICE

(71) Applicant: SHARP KABUSHIKI KAISHA, Osaka-shi, Osaka (JP)

(72) Inventors: Yasufumi Itoh, Osaka (JP); Manabu Onozaki, Osaka (JP); Motoki Takase, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/411,705

(22) PCT Filed: Jul. 3, 2013

(86) PCT No.: PCT/JP2013/068273
§ 371 (c)(1),
(2) Date: Dec. 29, 2014

(87) PCT Pub. No.: WO2014/007293
PCT Pub. Date: Jan. 9, 2014

(65) Prior Publication Data
US 2015/0160403 A1 Jun. 11, 2015

(30) Foreign Application Priority Data
Jul. 4, 2012 (JP) ................................. 2012-150924

(51) Int. Cl.
*F21V 8/00* (2006.01)
(52) U.S. Cl.
CPC ............ *G02B 6/0068* (2013.01); *G02B 6/0073* (2013.01)
(58) Field of Classification Search
USPC .................................................. 362/612, 613
See application file for complete search history.

(56) References Cited

U.S. PATENT DOCUMENTS

| | | | |
|---|---|---|---|
| 2006/0139952 A1 | 6/2006 | Inoue et al. | |
| 2009/0185394 A1 | 7/2009 | Takahashi | |
| 2009/0316433 A1* | 12/2009 | Shim ................... | G02B 6/0038 362/613 |
| 2011/0149594 A1 | 6/2011 | Terajima et al. | |
| 2011/0199790 A1* | 8/2011 | Murakoshi ........... | G02B 6/0068 362/621 |
| 2011/0273907 A1* | 11/2011 | Iwasaki ................ | G02B 6/0036 362/607 |
| 2012/0002427 A1 | 1/2012 | Moon et al. | |
| 2012/0320625 A1* | 12/2012 | Ishimoto .............. | G02B 6/0088 362/602 |
| 2013/0135561 A1* | 5/2013 | Kuromizu ............ | G02F 1/1336 349/65 |

FOREIGN PATENT DOCUMENTS

| | | |
|---|---|---|
| JM | 2009-81096 A | 4/2009 |
| JP | 9-231822 A | 9/1997 |
| JP | 10-39299 A | 2/1998 |
| JP | 10-83711 A | 3/1998 |
| JP | 10-293213 A | 11/1998 |
| JP | 2008-98190 A | 4/2008 |

(Continued)

*Primary Examiner* — Laura Tso
(74) *Attorney, Agent, or Firm* — Birch, Stewart, Kolasch & Birch, LLP

(57) ABSTRACT

The present invention makes it possible to (i) obtain a sufficient and uniform luminance on an entire surface, which is irradiated with light, of a light guide plate and (ii) achieve a reduction in cost. LED light source substrates (140*a*) and (140*b* ) are each configured to emit light having a first luminance gradient on an edge of a range, to be irradiated with light, which first luminance gradient is smaller than a second luminance gradient of light having a substantially uniform luminance on an entire range to be irradiated with light.

20 Claims, 24 Drawing Sheets

(56) References Cited

FOREIGN PATENT DOCUMENTS

| | | |
|---|---|---|
| JP | 4073435 B2 | 4/2008 |
| JP | 2010-20097 A | 1/2010 |
| JP | 2010-39299 A | 2/2010 |
| JP | 2011-119180 A | 6/2011 |
| JP | 2011-210674 A | 10/2011 |
| JP | 2012-15527 A | 1/2012 |
| WO | WO 2008/007487 A1 | 1/2008 |
| WO | WO 2012/066887 A1 | 5/2012 |

* cited by examiner

50: Surface light source device
120: Light guide plate
140a: LED light source substrate
140b: LED light source substrate 30: Surface light source device
120: Light guide plate
130: Reflecting sheet
131: Reflecting member
140a: LED light source substrate
140b: LED light source substrate
150: Diffusing sheet
160: Housing 130: Reflecting sheet
131: Reflecting member
132: Notched part 120: Light guide plate
131: Reflecting member
140a: LED light source substrate
140b: LED light source substrate
610: Wiring substrate
620: LED package
630: Reflecting sheet fixing member 120: Light guide plate
131: Reflecting member
140a: LED light source substrate
140b: LED light source substrate
141: Small substrate 120: Light guide plate
131: Reflecting member
140a: LED light source substrate
140b: LED light source substrate
141: Small substrate 100: LED light source device
120: Light guide plate
130: Reflecting sheet
140: LED light source substrate
150: Diffusing sheet
160: Housing 100: LED light source device
120: Light guide plate
130: Reflecting sheet
140: LED light source substrate
150: Diffusing sheet
160: Housing 600: LED light source substrate
601: Connector
610: Wiring substrate
620: LED package 611: Substrate
612: Wiring layer
613: Solder resist layer
621: LED element
622: Sealing resin
623: Bonding wire
624: Wiring layer
625: Substrate
626: Solder 500: LED light source substrate
511: Substrate
512: Connector
513: Wiring layer
514: Sealing resin
515: LED element
516: Bonding wire 500: LED light source substrate
511: Substrate
512: Connector
513: Wiring layer
514: Sealing resin
515: LED element
516: Bonding wire 120: Light guide plate
140a: LED light source substrate
140b: LED light source substrate 120: Light guide plate
140a: LED light source substrate
140b: LED light source substrate 120: Light guide plate
140: LED light source substrate 120: Light guide plate
140: LED light source substrate 120: Light guide plate
140: LED light source substrate
210a: Range which is irradiated with the light .300: Surface light source device
210ca: Range which is irradiated with the light
210cb: Range which is irradiated with the light
620a: LED package
620b: LED package In a case where there is no displacement In a case where led light source substrate 140a has downward displacement In a case where there is no displacement In a case where led light source substrate 140a has downward displacement Light sources arranged on edge each have low luminance Light sources are sparsely arranged on edge Direction of each of light sources arranged on edge is changed Direction of each of light sources arranged on edge is changed Light absorption member or light reflecting member is provided on edge Light absorption member or light reflecting member is provided on edge Light diffusion member is provided on edge

EDGE-LIGHT TYPE PLANAR LIGHT SOURCE DEVICE

TECHNICAL FIELD

The present invention relates to an edge-light type surface light source device.

BACKGROUND ART

An edge-light type surface light source device in which a light guide plate is employed has come into widespread use mainly as a backlight for a liquid crystal.

An edge-light type surface light source device has become prevalent in a backlight for a liquid crystal. This is because the edge-light type surface light source device is more effective in thinning (i) a backlight module for a liquid crystal and (ii) a product to which the backlight module is applied, as compared with a direct type backlight. Note that (a), in the direct type backlight, a light source is arranged directly under a liquid crystal panel instead of using a light guide plate, whereas (b), in the edge-light type surface light source device, (i) a linear light source is arranged on an edge of a light guide plate and (ii) the light guide plate converts light into plane emitting light (see, for example, Patent Literature 1). Furthermore, in some cases, the edge-light type surface light source device is employed also as an illumination.

Conventionally, a cold cathode fluorescent lamp (CCFL) has been prevalent in a light emitting source of such a light source device. Note, however, that the cold cathode fluorescent lamp (CCFL) has been recently replaced with a light emitting diode (LED). This makes it possible to (i) eliminate use of mercury, which (a) is employed in the CCFL and a fluorescent tube and (b) imposes a heavy burden on the environment, (ii) reduce power consumption, (iii) increase color reproducibility, and (iv) prolong a life of the light source device.

The following description will discuss a conventional edge-light type surface light source device with reference to FIGS. 14 through 25. FIG. 14 is an exploded perspective view illustrating a configuration of a conventional edge-light type surface light source device. FIG. 15 is a cross sectional view illustrating the conventional edge-light type surface light source device, illustrated in FIG. 14, which the conventional edge-light type surface light source device has been assembled.

An LED light source device 100, which is a conventional edge-light type surface light source device, includes a housing 160, a light guide plate 120, a reflecting sheet 130, a diffusing sheet 150, and an LED light source substrate 140 (see FIGS. 14 and 15).

In a case where a relatively thin light guide plate is used as the light guide plate 120, such a light guide plate may be referred to as a light guide sheet. Note, however, that there is no accurate difference between the light guide plate and the light guide sheet, so that these two terms have been in general use to suit the occasion. Note, under this description, that a member referred to as the light guide plate 120 is a general light guide section including a member referred to as the light guide sheet.

The LED light source substrate 140 emits light with which the light guide plate 120 is irradiated. The light emitted from the LED light source substrate 140 enters the light guide plate 120 via an incident surface which is a side surface of the light guide plate 120. Such incident light is mixed and uniformized in the light guide plate 120 so as to be surface light and then exit via a top surface of the light guide plate 120, i.e., via which the surface light exits.

The reflecting sheet 130 is arranged on a back surface side (on a side of a surface opposite to the surface via which the surface light exits) of the light guide plate 120. This causes light, which has leaked to the back surface side, to return into the light guide plate 120, so as to contribute to an increase in utilization efficiency of light.

The diffusing sheet 150 (i) is arranged on a front surface side (on a side of the surface via which the surface light exits) of the light guide plate 120 and (ii) uniformizes light which has exited via the front surface side so as to bring about an effect of reducing unevenness of luminance. The diffusing sheet 150 is used, as needed, in combination with various other optical sheets (e.g., a lens sheet, a polarization reflecting sheet, etc.).

The housing 160 (i) contains therein the aforementioned members and (ii) fixes and supports therein the members.

With the arrangement, the LED light source device 100 functions as a surface irradiation device which uses light emitted from the LED light source substrate 140.

The following description will specifically discuss, with reference to FIGS. 16 through 19, a configuration of an LED light source substrate of a conventional edge-light type surface light source device.

FIG. 16 is an external view illustrating an LED light source substrate of the conventional edge-light type surface light source device. FIG. 17 is a cross sectional view illustrating the LED light source substrate illustrated in FIG. 16.

The LED light source substrate 600 is configured such that a plurality of LED packages 620 and a connector 601 are provided on a flat wiring substrate 610 (see FIG. 16). The LED package 620 is electrically connected to an outside (not illustrated), via the connector 601 and a harness (not illustrated), so that light emitting is externally controlled.

The following description will further discuss in detail configurations of surroundings of the LED package 620 with reference to FIG. 17.

The wiring substrate 610 is configured such that a substrate 611, a wiring layer 612, and a solder resist layer 613 are laminated. The LED package 620 is connected and fixed on the wiring layer 612 via a solder 626.

The LED package 620 includes an LED element 621, a sealing resin 622, a bonding wire 623, a wiring layer 624, and a substrate 625. The LED element 621 is provided on the substrate 625 and is connected to the wiring layer 624 via the bonding wire 623. The sealing resin 622 seals an inside of the substrate 625 with a resin so as to protect parts and connections in the substrate 625. The sealing resin 622 can contain phosphors so as to convert a luminescent color of the LED element 621. For example, the sealing resin 622 can configure, by use of a blue LED element and yellow phosphors, an LED package which emits a white color. Via the wiring layer 624, (i) parts connected via the solder 626 and (ii) a part in which the LED element 621 are wired.

According to an example illustrated in FIG. 17, the wiring layer 624 is configured to pass through the substrate 625. The solder 626 is connected to the wiring layer 624 on a bottom surface side of the substrate 625, and the LED element 621 is connected to the wiring layer 624 on a top surface side of the substrate 625.

With the arrangement illustrated in FIG. 17, the LED element 621 is mechanically fixed, while being electrically connected to the outside (not illustrated) via the wiring substrate 610, the connector 601, and the harness (not illustrated). This allows light emitting of the LED element 621 to be externally controlled.

FIG. 18 is a view illustrating another example of an LED light source substrate of a conventional edge-light type surface light source device. FIG. 19 is a cross-sectional view, taken on A-A line of FIG. 18, illustrating the LED light source substrate. An LED light source substrate 500, illustrated in each of FIGS. 18 and 19, is configured such that an LED element 515 is provided on a substrate 511 by use of a COB (Chip On Board) technique, instead of employing an LED package. That is, the LED element 515 is directly provided on the substrate 511. Alternatively, the substrate 511 can include another layer (e.g., a wiring layer 513) on a surface of the substrate 511. In this case, the LED element 515 can be provided on the another layer. In any case, in a case where the COB technique is employed, the LED element 515 is directly provided as it is, instead of being indirectly provided on a wiring substrate after being contained in a package.

The substrate 511 has a surface (a horizontal top surface of the substrate 511 illustrated in FIG. 19) and depressed parts recessed from the surface. Each LED element 515 is provided in a corresponding one of the depressed parts.

According to the LED light source substrate 500, the wiring layer 513 and the LED element 515 are electrically connected via a bonding wire 516. The wiring layer 513 is electrically connected to an electrode terminal of a connector 512 (not particularly illustrated). With the arrangement, it possible to control light emitted from the LED element 515, by electrically controlling the harness (not illustrated) connected to the connector 512.

The LED element 515, the bonding wire 516, and their connected parts are easily damaged by an impact. In order to prevent such a damage, the LED element 515 and the bonding wire 516, including their connected parts, are sealed with a sealing resin 514. That is, the sealing resin 514 is injected into each of the depressed parts. With the arrangement, the LED element 515 and the bonding wire 516 (i) are tolerable to a certain degree of externally applied impact and (ii) are protected from moisture, a foreign matter, and the like.

By adding a colorant and/or phosphors to the sealing resin 514, it is possible to adjust a color tone of light emitted from the LED light source substrate 500. For example, in a case where (i) the LED element 515 emits blue light or an ultraviolet ray and (ii) suitable phosphors are contained in the sealing resin 514, the LED light source substrate 500 can emit white light.

In a case where the LED light source substrate 140 is configured by use of an LED package and a wiring substrate, as with the LED light source substrate 600, at least the following advantages (1) and (2) are obtained: (1) since an outer shape of a substrate can be prepared by press processing or router processing, it is easy to prepare a substrate with a relatively large size; and (2) it is possible to mount an LED package by use of a general mounter. On the other hand, a method of providing an LED element by use of the COB technique, as with the LED light source substrate 500, has at least the following advantages (i) and (ii): (i) since no solder needs to be used when the LED element is mounted, there is no limitation of a temperature caused by a temperature of a solder in use; and (ii) since an LED light source substrate can be produced in a final form in a step similar to a step employed during producing of the LED package, a substrate can be produced at a low cost in a case where the substrate has a small size.

FIG. 20 is a view illustrating a reflection pattern of light observed in a case of a conventional edge-light type surface light source device. According to FIG. 20, light emitted from an LED light source substrate 140 enters a light guide plate 120 via an incident surface of the light guide plate 120 (a left side of the light guide plate 120 illustrated in FIG. 20). The light guide plate 120 is made up of a light guide body 121 and a reflection pattern 122.

According to FIG. 20, a typical trajectory of incident light is indicated by the arrows. Light, which is (i) emitted from the LED light source substrate 140 and then (ii) incident on the incident surface of the light guide body 121, travels as follows. That is, in a case where an incident angle of the incident light is less than a certain angle, such incident light is refracted and enters inside the light guide body 121. On the other hand, in a case where the incident angle is more than a certain angle, such an incident light is totally reflected from the incident surface and will never enter inside the light guide body 121.

The incident light, which has entered the light guide body 121, repeats a total reflection on a top surface and a bottom surface of the light guide body 121. In a case where the incident light reaches a reflection pattern 122, the incident light is diffused and reflected from the reflection pattern 122. This causes many components of the incident light to exit via the top surface, i.e., an emitting surface of the light guide body 121.

Normally, the reflection pattern 122 is properly set in order to (i) uniformize a surface light emitting pattern or (ii) realize a desired surface light emitting pattern. For example, in order to realize a uniform light emitting pattern, the reflection pattern 122 is set as follows. That is, the reflection pattern 122 is set so as to have a high density in a part far from a light source (e.g., (i) constituents of the reflection pattern are large, (ii) the number of the constituents per unit area is large, or (iii) a combination of the above (i) and (ii), etc.), whereas the reflection pattern is set so as to have a low density in a part near the light source (e.g., (a) constituents of the reflection pattern are small, (b) the number of the constituents per unit area is small, or (c) a combination of the above (a) and (b), etc.).

Examples of a material of the light guide body 121 encompass (i) an acrylic resin which has a very high transmittance, (ii) a polycarbonate which has (a) a certain degree of high transmittance and (b) a high strength. Particularly, the acrylic resin is often employed as a material of a surface light source module having a certain degree of large size. This is because an amount of light, which is lost due to light absorption by the light guide plate, cannot be ignored. On the other hand, the polycarbonate is often employed as a material of a surface light source module which is in a relatively small size and needs a strength.

The reflection pattern 122 can be added to the light guide body 121 by carrying out laser marking with respect to the light guide body 121, applying a paint to the light guide body 121, or the like. Alternatively, the reflection pattern 122 can be realized in a shape which is simultaneously formed when the light guide body 121 is formed.

The following description will discuss, with reference to FIGS. 21 through 24, an arrangement of a light source substrate of a conventional edge-light type surface light source device. FIG. 21 through are each a view schematically illustrating an arrangement(s) of a light source substrate(s) of a conventional edge-light type surface light source device.

According to an example illustrated in FIG. 21, a light source substrate 140a and a light source substrate 140b are arranged on a respective pair of long sides of the light guide plate 120 (an upper side and a lower side of the light guide plate 120 illustrated in FIG. 21). The light source substrate 140*a* and the light source substrate 140*b* have lengths equal to those of the respective pair of long sides of the light guide plate 120.

According to an example illustrated in FIG. 22, a light source substrate 140*a* and a light source substrate 140*b* are arranged on a respective pair of short sides of the light guide plate 120 (a left side and a right side of the light guide plate 120 illustrated in FIG. 22). The light source substrate 140*a* and the light source substrate 140*b* have lengths equal to those of the respective pair of short sides of the light guide plate 120.

According to an example illustrated in FIG. 23, a light source substrate 140 is arranged on a long side of a light guide plate 120 (a lower side of the light guide plate 120 illustrated in FIG. 23). The light source substrate 140 has a length equal to that of the long side of the light guide plate 120.

According to an example illustrated in FIG. 24, a light source substrate 140 is arranged on a short side of a light guide plate 120 (a left side of the light guide plate 120 illustrated in FIG. 24). The light source substrate 140 has a length equal to that of the short side of the light guide plate 120.

Note here that a total length of a light source substrate can be made shorter in a case where the light source substrate is arranged on a short side of a light guide plate, as compared with a case where the light source substrate is arranged on a long side of the light guide plate. The total length of the light source substrate can be made shorter in a case where the light source substrate is arranged on one (1) side of the light guide plate, as compared with a case where light source substrates are arranged on respective two sides of the light guide plate.

For example, a total length of a light source substrate can be made shorter in the arrangement illustrated in FIG. 22, as compared with the arrangement illustrated in FIG. 21. The total length of the light source substrate can be made shorter in the arrangement illustrated in FIG. 23, as compared with the arrangement illustrated in FIG. 21. The total length of the light source substrate can be made shorter in the arrangement illustrated in FIG. 24, as compared with the arrangement illustrated in FIG. 22.

Generally, shortening a total length of a light source substrate brings about many advantages. Examples of such advantages encompass (i) a reduction in production cost, (ii) a reduction in product weight, (iii) a reduction in burden on the environment due to a reduction in amount of a material to be used, and (iv) a reduction in a transportation cost due to a reduction in size and weight of a product.

Note, however, that even in a case where the arrangement illustrated in FIG. 24 is employed which can make shortest the total length of the light source substrate, the light source substrate needs to have lengths each equal to that of a corresponding side of the light guide plate. This is because it is necessary to meet a demand for uniformizing a luminance in the light guide plate as much as possible. Such a demand can be easily met in a case where the light source substrate has lengths each equal to that of a corresponding side of the light guide plate. For example, in a case where (i) the arrangement illustrated in FIG. 24 is employed and (ii) the light source substrate has a length shorter than that of a corresponding side of the light guide plate, a problem arises that a sufficient luminance cannot be obtained in a part of the light guide plate.

The following description will specifically discuss such a problem with reference to FIG. 25. FIG. 25 is a view illustrating a range which is irradiated with light emitted from a light source substrate of a conventional surface light source device in which the light source substrate is arranged on a side of a light guide plate. FIG. 25 illustrates an example in which the conventional surface light source device is configured such that a light source substrate 140 which has a length shorter than that of a short side of a light guide plate 120 is tentatively arranged on the short side of the light guide plate 120.

According to the conventional surface light source device, light emitted from the LED light source substrate 140 travels in a right side direction of the light guide plate 120. A range 210*a* which is irradiated with the light has (i) a spread which is at a refraction angle α with a direction where an upper side of the light guide plate 120 extends and (ii) a spread which is at a refraction angle α with a direction where a lower side of the light guide plate 120 extends (see FIG. 25).

This is because the light emitted from the LED light source substrate 140 is refracted when it goes through a side surface (i.e., a boundary surface) of the light guide plate 120. This causes dark parts (unhatched parts illustrated in FIG. 25), which are not irradiated with light emitted from the LED light source substrate 140, to be formed in respective of an upper left corner part and an lower left corner part of the light guide plate 120 (see FIG. 25).

As described above, in a case where the light source substrate 140 has a length shorter than that of a corresponding side of the light guide plate 120, the range 210*a* can be directly irradiated with light, while the dark parts cannot be directly irradiated with light. This prevents the light guide plate of the conventional surface light source device from obtaining a sufficient luminance. Accordingly, the light source substrate 140 cannot have a length shorter than that of a corresponding short side of the light guide plate 120.

It is true that, in a case where the length of the long side of the light guide plate 120 is extended, instead of shortening the length of the light source substrate 140, an entire range of the light guide plate 120 in an original size can be a range which is irradiated with light. Note, however, that a length of an extended part of the long side of the light guide plate 120 cannot normally exceed ten percent of the length of the short side of the light guide plate 120.

For example, in a case where the light guide plate 120 is made of an acrylic resin (a refractive index: 1.49), a critical angle α is approximately 42 degrees. Some optical glasses each have a refractive index of approximately 1.43, which is lower than that of the acrylic resin. In this case where the light guide plate 120 is made of such an optical glass, a critical angle α is approximately 45 degrees. In this case, if the light source substrate 140 has a length less than 0.8 times of a length of a corresponding short side of the light guide plate 120, a length of the extended part of the long side of the light guide plate 120 exceeds ten percent of the length of the corresponding short side of the light guide plate 120. Accordingly, it is very difficult that the light source substrate 140 has a length not more than 0.8 times of the length of the corresponding short side of the light guide plate 120.

Having said that, a demand remains unchanged for realizing an arrangement in which a light source substrate has a length shorter than that of a corresponding side of a light guide plate. In view of the circumstances, in order to meet such a demand, a technique has been devised in which a light source substrate has a length shorter than that of a corresponding side of a light guide plate.

For example, Patent Literature 2 discloses an arrangement in which (i) a light source has a length shorter than that of a short side of a light guide plate and (ii) an illumination light introducing section is provided so that illumination light emitted from the light source is spread so as to be introduced to the light guide plate.

Patent Literature 3 discloses an arrangement in which (i) a light source has a length shorter than that of a short side of a light guide plate and (ii) the light guide plate has a light scattering hole so that light is diffused in the light guide plate.

Patent Literatures 4 and 5 each disclose an arrangement in which a light source having an L shape is arranged in a corner part of a light guide plate so as to uniformize a display luminance, while reducing power consumption of the light source.

CITATION LIST

Patent Literatures

Patent Literature 1
Japanese Patent Application Publication, Tokukai, No. 2010-039299 A (Publication Date: Feb. 18, 2010)
Patent Literature 2
Japanese Patent Application Publication, Tokukaihei, No. 09-231822 A (Publication Date: Sep. 5, 1997)
Patent Literature 3
Japanese Patent Application Publication, Tokukaihei, No. 10-293213 A (Publication Date: Nov. 4, 1998)
Patent Literature 4
Japanese Patent Application Publication, Tokukaihei, No. 10-039299 A (Publication Date: Feb. 13, 1998)
Patent Literature 5
Japanese Patent Application Publication, Tokukaihei, No. 10-083711 A (Publication Date: Mar. 31, 1998)

SUMMARY OF INVENTION

Technical Problem

Note, however, that with the use of the technique disclosed in Patent Literature 2, an illumination light introducing section needs to be provided between a light source and a light guide plate. This causes (i) an increase in cost and (ii) an edge part of the light guide plate to have a space in which the illumination light introducing section is to be provided, so that a surface light source device becomes large in size. The use of the technique disclosed in Patent Literature 2 further causes an increase in incident angle at which light enters the light guide plate. This causes a reduction in incident efficiency at which light enters the light guide plate.

With the use of the technique disclosed in Patent Literature 3, a light guide plate needs to have a light scattering hole. Such a process needs a degree of difficulty in forming a light scattering hole, so as to cause a great increase in cost.

With the use of the techniques disclosed in Patent Literatures 4 and 5, a light source having a complicated configuration of an L shape needs to be employed. This causes an increase in cost. According to such techniques, light sources are substantially provided on respective long and short sides of a light guide plate. It is therefore not possible to save a space on a side part of either the long side or the short side of the light guide plate.

As is clear from the description, it has been difficult, in the techniques disclosed in Patent Literatures 2 through 5, that (i) an entire surface, via which surface light exits, of the light guide plate has a sufficient and uniform luminance and (ii) a reduction in cost is achieved.

The present invention has been made in view of the problems, and an object of the present invention is to provide an edge-light type surface light source device which makes it possible to (i) obtain a sufficient and uniform luminance on an entire surface, which is irradiated with light, of a light guide plate and (ii) achieve a reduction in cost.

Solution to Problem

In order to attain the object, an edge-light type surface light source device of the present invention is an edge-light type surface light source device, including: a light guide section; and a plurality of light sources each of which emits light via a side surface of the light guide section toward the light guide section, the plurality of light sources being provided on a pair of sides of the light guide section which pair of sides face each other, a longest one of light emitting parts of the respective plurality of light sources having a length shorter than lengths of the respective pair of sides of the light guide section on which the plurality of light sources are provided, the plurality of light sources being each configured to emit light having a first luminance gradient on an edge of a range, to be irradiated with light, which first luminance gradient is smaller than a second luminance gradient of light having a substantially uniform luminance on an entire range to be irradiated with light.

With the arrangement, light sources each of which has a short length are employed as the plurality of light sources and the plurality of light sources are arranged as described above. This makes it possible to obtain a sufficient range which is irradiated with light emitted from the plurality of light sources.

With the arrangement, the plurality of light sources each emit light having a small luminance gradient on an edge of a range to be irradiated with light. This prevents a luminance in a specific region of the light guide section from being distinctly reduced due to a position shifting of each of the plurality of light sources. This makes it possible to obtain a uniform luminance on an entire surface, which is irradiated with light, of the light guide plate (light guide section).

Advantageous Effects of Invention

As has been described, an edge-light type surface light source device of the present invention is an edge-light type surface light source device, including: a light guide section; and a plurality of light sources each of which emits light via a side surface of the light guide section toward the light guide section, the plurality of light sources being provided on a pair of sides of the light guide section which pair of sides face each other, a longest one of light emitting parts of the respective plurality of light sources having a length shorter than lengths of the respective pair of sides of the light guide section on which the plurality of light sources are provided, the plurality of light sources being each configured to emit light having a first luminance gradient on an edge of a range, to be irradiated with light, which first luminance gradient is smaller than a second luminance gradient of light having a substantially uniform luminance on an entire range to be irradiated with light.

Accordingly, the present invention brings about an effect of (i) providing a sufficient and uniform luminance on an entire surface, to be irradiated with light, of a light guide plate and (ii) achieving a reduction in cost.

DESCRIPTION OF EMBODIMENTS

Figure 1:
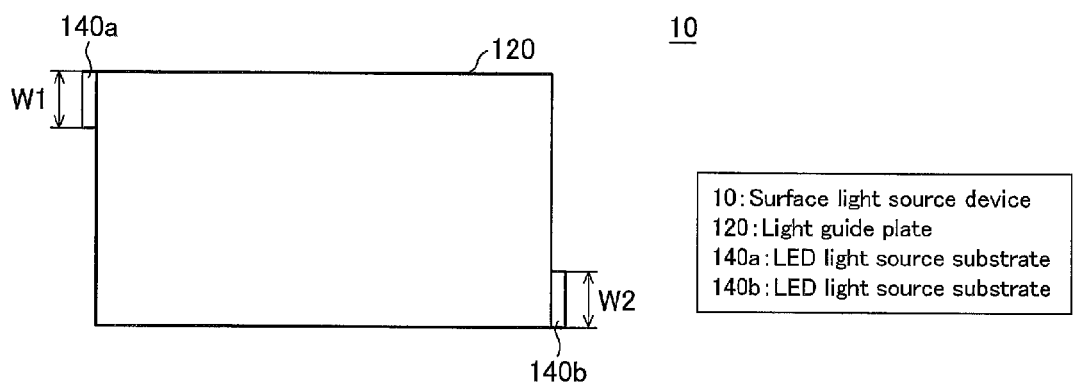
FIG. 1 is a view schematically illustrating a configuration of a surface light source device in accordance with Embodiment 1 of the present invention.

The following description will discuss Embodiments of the present invention with reference to the drawings. Note that members which have identical configurations are given identical reference numerals, and will not be repeatedly described in detail.

[Embodiment 1]

Figure 2:
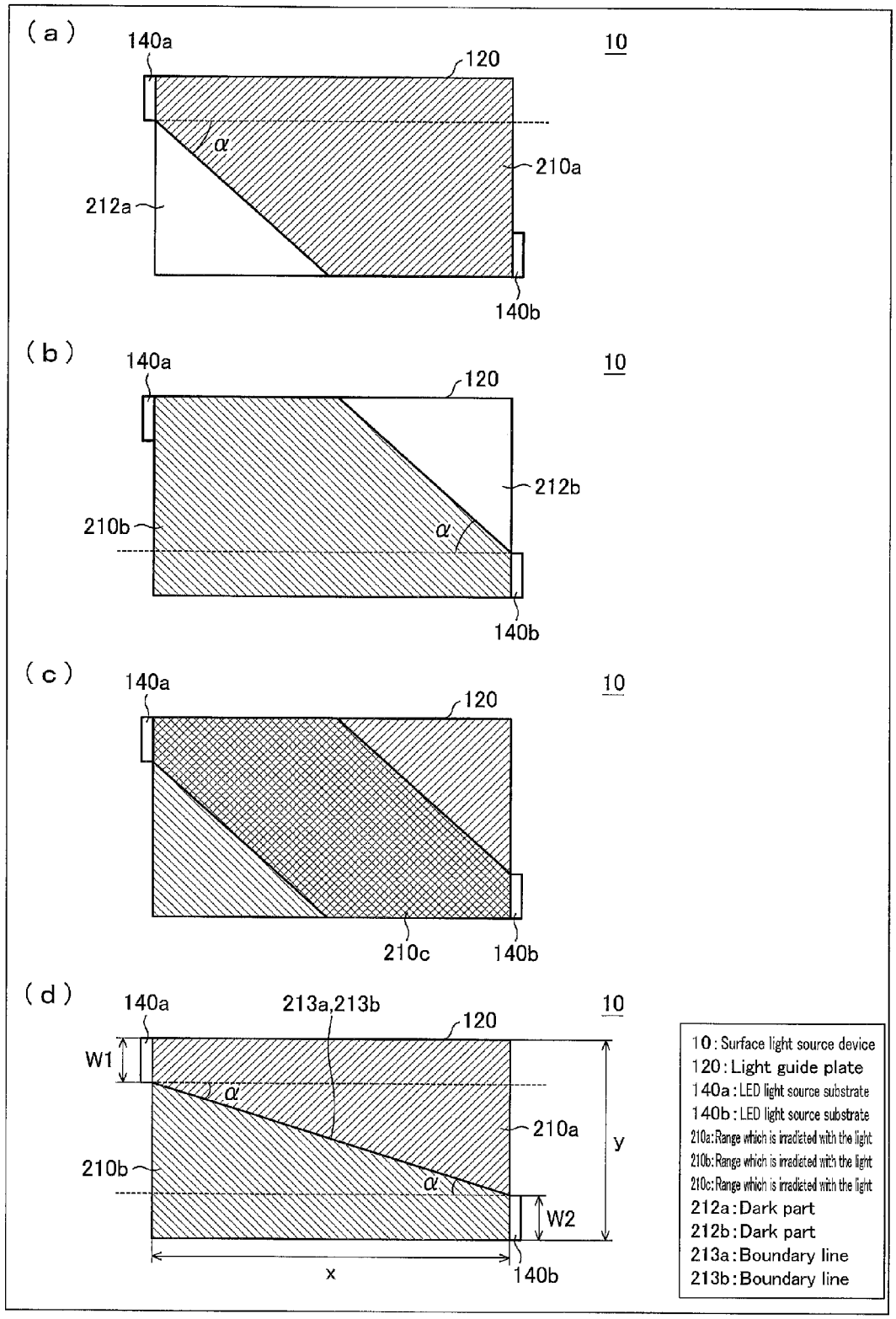
FIGS. 2(a)-2(d) are ,(is a view illustrating a range which is irradiated with light emitted from each of LED light source substrates of the surface light source device in accordance with Embodiment 1 of the present invention.

The following description will discuss, with reference to FIGS. 1 and 2, a surface light source device 10 of Embodiment 1, which is an example of an edge-light type surface light source device in accordance with the present invention.

(Configuration of Surface Light Source Device)

FIG. 1 is a view schematically illustrating a configuration of the surface light source device 10 in accordance with Embodiment 1 of the present invention. The surface light source device 10 illustrated in FIG. 1 includes a light guide plate (a light guide section) 120 and LED light source substrates (light sources) 140a and 140b. The surface light source device 10 is a so-called edge-light type surface light source device. According to the surface light source device 10, the LED light source substrates 140a and 140b are provided on respective side surfaces of the light guide plate 120 so as to emit light toward the side surfaces of the light guide plate 120.

The light guide plate 120 has a landscape rectangular shape in accordance with a shape of a liquid crystal display panel, which is to be mounted in a display device together with the light guide plate 120. The light guide plate 120 has (i) a pair of short sides (a left side and a right side of the light guide plate 120 illustrated in FIG. 1) facing each other and (ii) a pair of long sides (an upper side and a lower side of the light guide plate 120 illustrated in FIG. 1) facing each other (see FIG. 1).

According to the surface light source device 10, the LED light source substrates are arranged in the respective pair of short sides. Specifically, the LED light source substrate 140a is arranged on the left side of the light guide plate 120, whereas the LED light source substrate 140b is arranged on the right side of the light guide plate 120.

It should be noted that the LED light source substrate 140a is provided in an upper end part of the left side of the light guide plate 120, whereas the LED light source substrate 140b is provided in a lower end part of the right side of the light guide plate 120. That is, the LED light source substrate 140a is provided near an upper left corner part of the light guide plate 120, whereas the LED light source substrate 140b is provided near a lower right corner part of the light guide plate 120.

It should be further noted that the LED light source substrates 140a has a light emitting part that has a distinctly short length W1, and W2, which is a length of a light emitting part of the LED light source substrate 140b, are distinctly short. Specifically, a total length, i.e., a sum total of the lengths W1 and W2, is shorter than the short side of the light guide plate 120. This is because the aforementioned arrangements of the respective two LED light source substrates 140a and 140b make it possible to obtain a sufficient range, which is irradiated with light, of the light guide plate 120, without lengthening the lengths of the light emitting parts of the respective two LED light source substrates 140a and 140b.

(Range Irradiated with Light)

(a) through (d) of FIG. 2 are views each illustrating a range (also referred to as a region) which is irradiated with light emitted from each of the LED light source substrates of the surface light source device 10 in accordance with Embodiment 1 of the present invention. (a) of FIG. 2 illustrates a range 210a which is irradiated with light emitted from the LED light source substrate 140a. (b) of FIG. 2 illustrates a range 210b which is irradiated with light emitted from the LED light source substrate 140b. (c) of FIG. 2 illustrates ranges which are irradiated with light emitted from the respective LED light source substrates 140a and 140b.

(Range Irradiated with Light Emitted from LED Light Source Substrate 140a)

According to the surface light source device 10 of Embodiment 1, the light emitted from the LED light source substrate 140a travels towards a right side of the light guide plate 120. The range 210a has a spread which is at a refraction angle α with a direction where a lower side of the light guide plate 120 extends (see (a) of FIG. 2). This is because the light emitted from the LED light source substrate 140a is refracted when it goes through a side surface (i.e., a boundary surface) of the light guide plate 120. This causes a dark part 212a (an unhatched part illustrated in (a) of FIG. 2), which is not irradiated with the light emitted from the LED light source substrate 140a, to be formed in a lower left corner part of the light guide plate 120 (see (a) of FIG. 2).

Note here that a refractive index λ of the light guide plate 120 is more than 1. This causes the refraction angle α, at which a refracted lay is with a normal line, is less than 90 degrees.

A relation between the refractive index λ and the refraction angle α can be expressed by the following Equation (1).

$$\sin \alpha = 1/\lambda \quad (1)$$

(Range Irradiated with Light Emitted from LED Light Source Substrate 140b)

According to the surface light source device 10 of Embodiment 1, the light emitted from the LED light source substrate 140b travels towards a left side of the light guide plate 120. The range 210b of the light emitted from the LED light source substrate 140b has a spread which is at a refraction angle α with a direction where an upper side of the light guide plate 120 extends (see (b) of FIG. 2). This causes a dark part 212b (an unhatched part illustrated in (b) of FIG. 2), which is not irradiated with the light emitted from the LED light source substrate 140b, to be formed in an upper right corner part of the light guide plate 120.

(Ranges Irradiated with Light Emitted from Respective LED Light Source Substrates 140a and 140b)

(c) of FIG. 2 illustrates the range 210a and the range 210b which are superimposed on each other. A range 210c indicated by a third hatching illustrated in (c) of FIG. 2 is a region in which the range 210a is superimposed on the range 210b.

While only the LED light source substrate 140a is being turned on, the dark part 212a occurs (see (a) of FIG. 2), whereas while only the LED light source substrate 140b is being turned on, the dark part 212b occurs (see (b) of FIG. 2). In contrast, while the LED light source substrates 140a and 140b are both being turned on in the light guide plate 120, the dark part 212a and the dark part 212b are compensated by the range 210b and the range 210a, respectively. It follows that an entire region of the light guide plate 120 becomes a range which is irradiated with light (see (c) of FIG. 2).

(Effect of Embodiment 1)

The surface light source device 10 of Embodiment 1 thus employs the LED light source substrates whose respective light emitting parts each have a distinctly short length. Note, however, that the aforementioned devised arrangements of the respective LED light source substrates make it possible for the light guide plate 120 to have a sufficient range which is irradiated with light.

Note that, in a case where (i) the lengths of the respective sides of the light guide plate 120 and/or (ii) a refractive index λ of the light guide plate 120 differ(s) from those of Embodiment 1 and in a case where the length of the light emitting part of at least one of the LED light source substrate 140a and the LED light source substrate 140b is changed as needed, it is possible that an entire region of the light guide plate 120 becomes a range which is irradiated with light, as with Embodiment 1.

In this case, the entire region of the light guide plate 120 can become the range which is irradiated with light, in a case where the following Equation (2) is satisfied, where (i) x indicates a length of the long side of the light guide plate 120, (ii) y indicates a length of the short side of the light guide plate 120, and (iii) L indicates a sum total of the lengths of the respective LED light source substrate 140a and the LED light source substrate 140b.

$$L + x/\sqrt{(\lambda^2 - 1)} \geq y \quad (2)$$

In order to explain Equation (2) in more detail, (d) of FIG. 2 illustrates an example case where a left side is equal to a right side in Equation (2). That is, (d) of FIG. 2 illustrates an example case where the range 210c is equal to 0 (zero), in which range 210c (a) the range 210a which is irradiated with the light emitted from the LED light source substrate 140a and (b) the range 210b which is irradiated with the light emitted from the LED light source substrate 140b are superimposed on each other. In such an example case, the ranges 210a and 210b can cover the entire region of the light guide plate 120. Namely, in such an example case, L becomes shortest while Equation (2) is satisfied, where L is a sum total of the lengths of the respective LED light source substrates 140a and 140b.

In this example case, (i) a boundary line 213a of the range 210a which is irradiated with the light emitted from the LED light source substrate 140a and (ii) a boundary line 213b of the range 210b which is irradiated with the light emitted from the LED light source substrate 140b, are superimposed on a single straight line along a refraction angle α satisfying Equation (1) (see (d) of FIG. 2).

As is clear from (d) of FIG. 2, Equation (2') is satisfied by (i) W1 and W2 which indicate the lengths of the respective LED light source substrates 140a and 140b and (ii) y which indicates the length of the short side of the light guide plate 120.

$$W1 + x \times \tan(\alpha) + W2 = y \quad (2')$$

In Equation (2'), as described above, (i) W1+W2, which indicates the sum total of the lengths of the respective LED light source substrates 140a and 140b, is equal to L and (ii) the refraction angle α is an angle satisfying Equation (1). Accordingly, in a case where Equation (2') is rewritten by use of (i) L and (ii) a refractive index λ of the light guide plate, Equation (2') indicates a case where the left side is equal to the right side in Equation (2).

In a case where a left side exceeds a right side (y: the length of the short side of the light guide plate 120) in Equation (2'), the range 210c is increased. Note that the range 210c indicates (a) the range which is irradiated with the light emitted from the LED light source substrate 140a and (b) the range which is irradiated with the light emitted from the LED light source substrate 140b are superimposed on each other.

For example, in a case where the length of the LED light source substrate 140a becomes longer in (d) of FIG. 2, the boundary line 213a is moved downward. On the other hand, in a case where the length of the LED light source substrate 140b becomes longer in (d) of FIG. 2, the boundary line 213b is moved upward. Accordingly, in a case where the length of at least one of the LED light source substrate 140a and the LED light source substrate 140b becomes longer than the length in (d) of FIG. 2, the range 210c occurs in which the range 210a is superimposed on the range 210b (see (c) of FIG. 2).

Note that, in some cases, it is possible to shorten the length of the light emitting part (the length of at least one of the LED light source substrate 140a and the LED light source substrate 140b). Any L can satisfy Equation (2), for example, in a case where (i) an acrylic resin (λ=1.49) is employed as a material of the light guide plate 120 and (ii) an aspect ratio of the light guide plate 120 is 9:16, which is generally employed in a liquid crystal television or the like. That is, it is possible to shorten the length of the light emitting part as much as possible.

According to the surface light source device 10 of Embodiment 1, a luminance in each corner part of the light guide plate 120 can be relatively increased.

For example, according to the surface light source device 10, the LED light source substrate 140a is arranged in an upper left corner part of the light guide plate 120. This makes it possible to increase (i) a luminance in an upper right corner part of the light guide plate 120, which upper right corner part is located in a normal line direction of the LED light source substrate 140a as well as (ii) a luminance in the upper left corner part. This is because a linear LED light source substrate generally emits light having a high intensity in a normal line direction.

Similarly, according to the surface light source device 10, the LED light source substrate 140b is arranged in a lower right corner part of the light guide plate 120. This makes it possible to increase (i) a luminance in a lower left corner part of the light guide plate 120, which lower left corner part is located in a normal line direction of the LED light source substrate 140b as well as (ii) a luminance in the lower right corner part.

According to the surface light source device 10 of Embodiment 1, the LED light source substrates 140a and 140b are provided to the light guide plate 120 so as to be symmetric with respect to a point. This causes a reflection pattern of light emitted from the respective LED light source substrates 140a and 140b to be also symmetric with respect to a point in the light guide plate 120. As such, it is possible to incorporate surface light source devices 10 into a liquid crystal display panel or the like so that the surface light source devices 10 are symmetric with respect to each other while rotating each of the surface light source devices 10 by 180 degrees. This allows the surface light source device 10 of Embodiment 1 to increase productivity when the surface light source device 10 is incorporated into such a liquid crystal display panel or the like. In this case, it is preferable to employ identical LED light source substrates as the respective LED light source substrates 140a and 140b. This allows an effect such as a reduction in cost of parts to be brought about.

[Embodiment 2]

Figure 3:
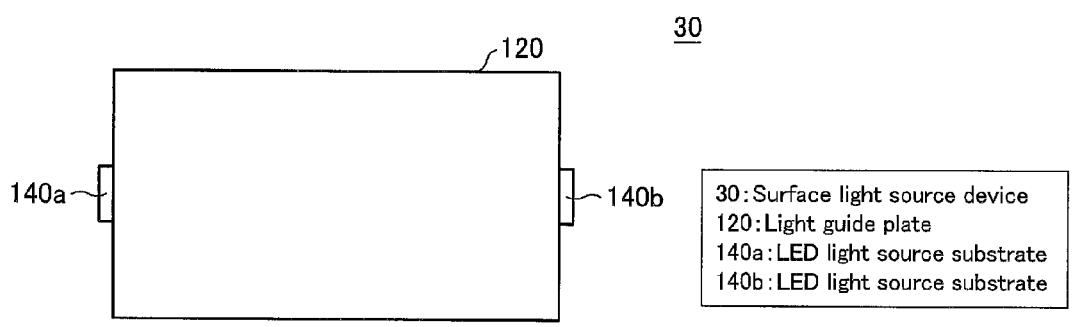
FIG. 3 is a view schematically illustrating a configuration of a surface light source device in accordance with Embodiment 2 of the present invention.
Figure 4:
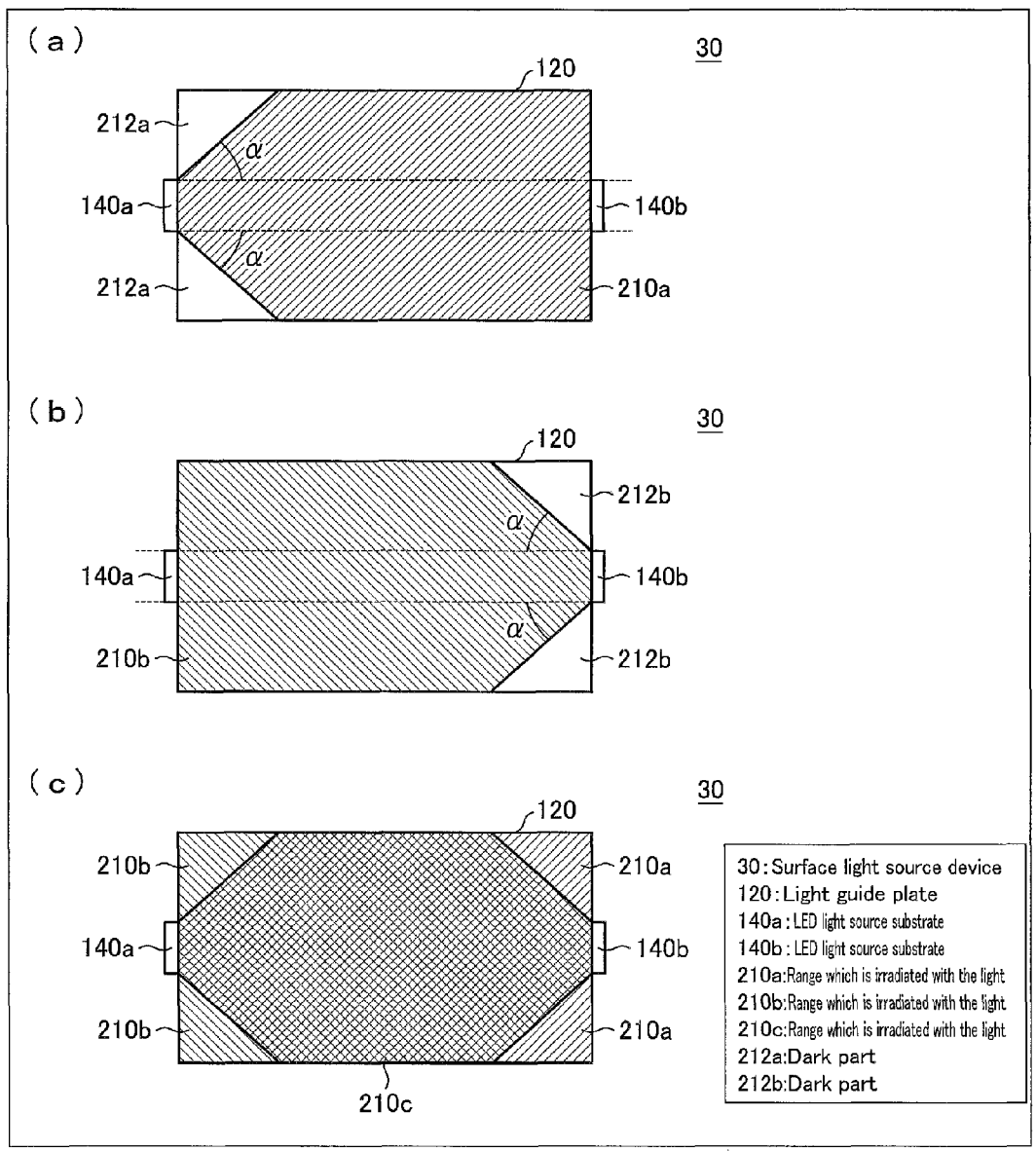
FIGS. 4(a)-4(c) are is a view illustrating a range which is irradiated with light emitted from each of LED light source substrates of the surface light source device in accordance with Embodiment 2 of the present invention.

The following description will discuss, with reference to FIGS. 3 and 4, a surface light source device 30 of Embodiment 2, which is an example of an edge-light type light source substrate in accordance with the present invention.

FIG. 3 is a view schematically illustrating a configuration of a surface light source device 30 in accordance with Embodiment 2 of the present invention. The surface light source device 30 of Embodiment 2 is similar to the surface light source device 10, except for arrangements of respective LED light source substrates.

Specifically, according to the surface light source device 30 of Embodiment 2, an LED light source substrate 140a is provided in a center part of a left side of a light guide plate 120, and an LED light source substrate 140b is provided in a center part of a right side of the light guide plate 120 (see FIG. 3).

(a) through (c) of FIG. 4 are views each illustrating a range which is irradiated with light emitted from each of the LED light source substrates of the surface light source device 30 in accordance with Embodiment 2 of the present invention. (a)

of FIG. 4 illustrates a range 210a which is irradiated with light emitted from the LED light source substrate 140a. (b) of FIG. 4 illustrates a range 210b which is irradiated with light emitted from the LED light source substrate 140b. (c) of FIG. 4 illustrates ranges which are irradiated with light emitted from the respective LED light source substrates 140a and 140b.

According to the surface light source device 30 of Embodiment 2, the light emitted from the LED light source substrate 140a travels towards a right side of the light guide plate 120. The range 210a has (i) a spread which is at a refraction angle α with a direction where an upper side of the light guide plate 120 extends and (ii) a spread which is at a refraction angle α with a direction where a lower side of the light guide plate 120 extends (see (a) of FIG. 4). This causes dark parts 212a, which are not irradiated with light emitted from the LED light source substrate 140a, to be formed in respective of an upper left corner part and a lower left corner part of the light guide plate 120.

According to the surface light source device 30 of Embodiment 2, the light emitted from the LED light source substrate 140b travels towards a left side of the light guide plate 120. The range 210b has (i) a spread which is at a refraction angle α with a direction where the upper side of the light guide plate 120 extends and (ii) a spread which is at a refraction angle α with a direction where the lower side of the light guide plate 120 extends (see (b) of FIG. 4). This causes dark parts 212b, which are not irradiated with light emitted from the LED light source substrate 140b, to be formed in respective of an upper right corner part and a lower right corner part of the light guide plate 120.

According to the surface light source device 30 of Embodiment 2, while only the LED light source substrate 140a is being turned on, the dark parts 212a occur (see (a) of FIG. 4), whereas while only the LED light source substrate 140b is being turned on, the dark parts 212b occur (see (b) of FIG. 4). In contrast, while the LED light source substrates 140a and 140b are both being turned on in the light guide plate 120, the dark parts 212a and the dark parts 212b are compensated by the range 210b and the range 210a, respectively. It follows that an entire region of the light guide plate 120 becomes a range which is irradiated with light (see (c) of FIG. 4).

That is, the surface light source device 30 of Embodiment 2 also employs the LED light source substrates whose light emitting parts each have a distinctly short length. Note, however, that the aforementioned devised arrangements of the respective LED light source substrates make it possible for the light guide plate 120 to have a sufficient range which is irradiated with light.

According to the surface light source device 30, as with the surface light source device 10, light can be exited from the entire region of the light guide plate 120 by use of LED light source substrates which are short in length. Particularly, with the arrangement of the surface light source device 30, it is possible to form, in the light guide plate 120, a horizontally and vertically symmetrical irradiation pattern, which appears more natural to a viewer.

Figure 25:
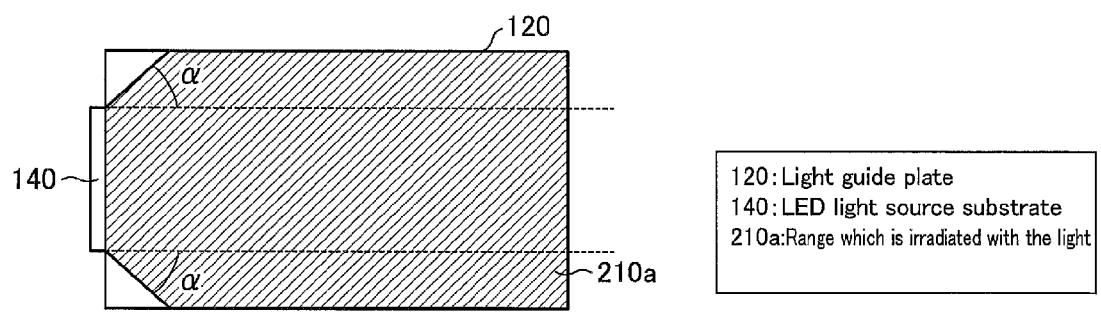
FIG. 25 is a view illustrating a range which is irradiated with light emitted from a light source substrate of a conventional surface light source device in which the light source substrate is arranged in a side of a light guide plate.

As has been already described, with the use of the conventional technique (see FIG. 25), in a case where the light source substrate 140 has a length less than 0.8 times of the length of the short side of the light guide plate 120, the length of the extended part of the light guide plate 120 needs to exceed ten percent of the length of the short side of the light guide plate 120. According to the surface light source device 30 of Embodiment 2, on the other hand, even in a case where the light source substrate 140 has a length less than 0.8 times of the length of the short side of the light guide plate 120, the length of the extended part of the light guide plate 120 is sufficiently less than ten percent of the length of the short side of the light guide plate 120. This allows the length of the extended part of the light guide plate 120 to be substantially 0 (zero).

[Embodiment 3]

Figure 5:
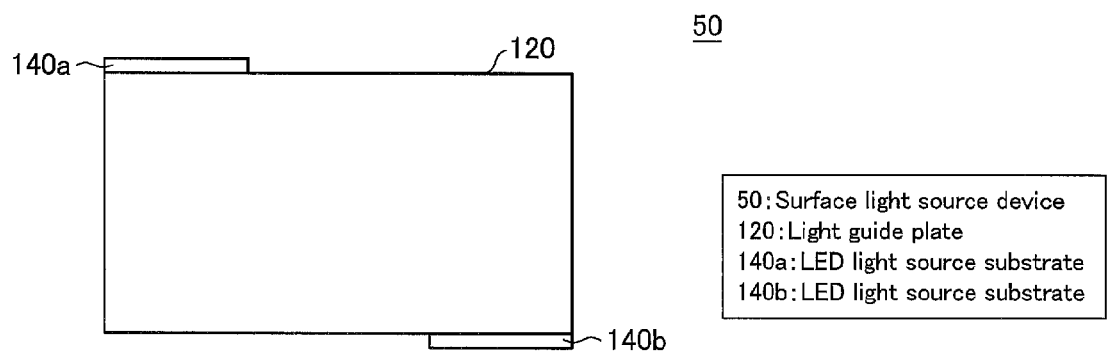
FIG. 5 is a view schematically illustrating a configuration of a surface light source device in accordance with Embodiment 3 of the present invention.
Figure 6:
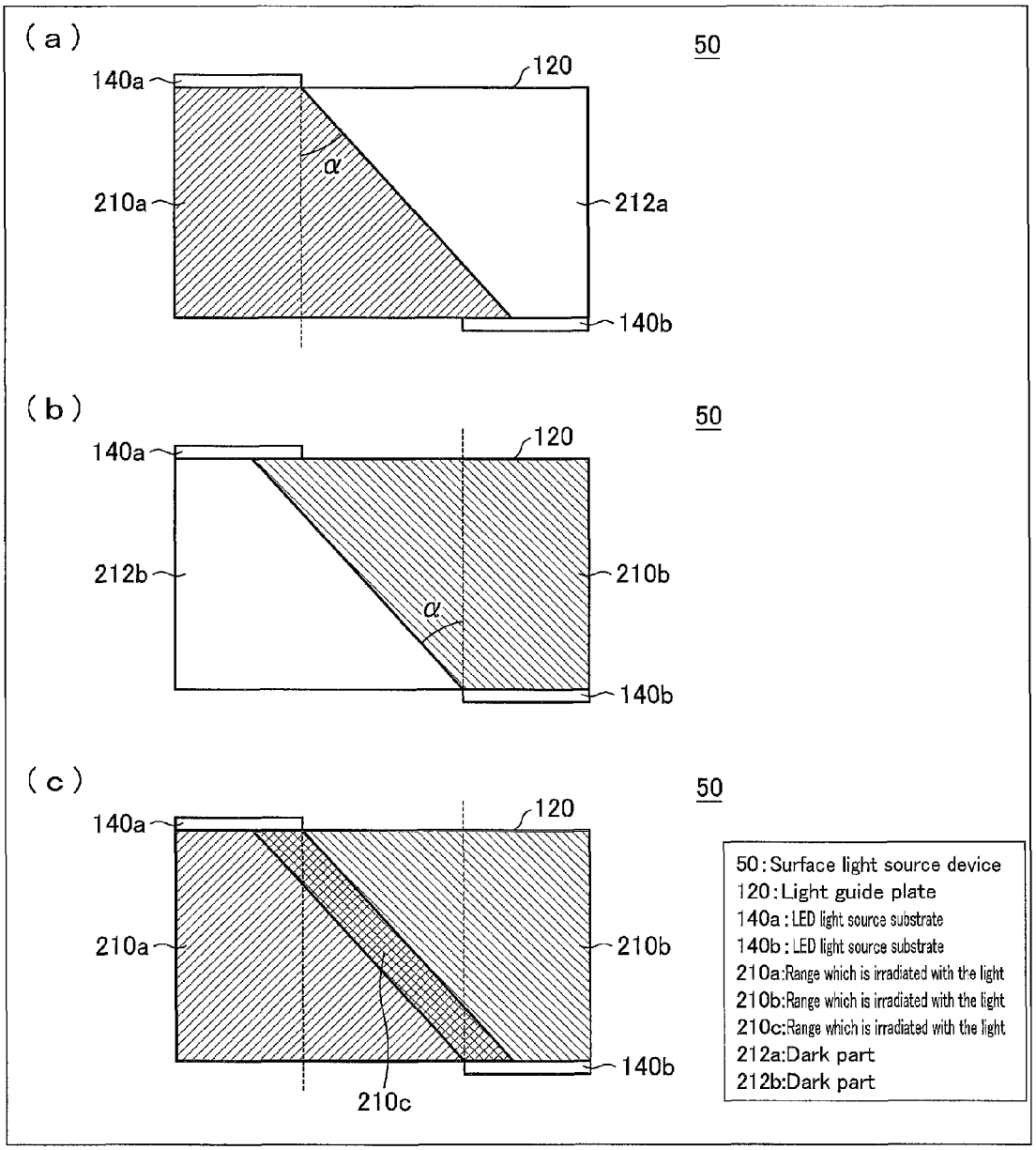
FIGS. 6(a)-6(c) are a view illustrating a range which is irradiated with light emitted from each of LED light source substrates of the surface light source device in accordance with Embodiment 3 of the present invention.

The following description will discuss, with reference to FIGS. 5 and 6, a surface light source device 50 of Embodiment 3, which is an example of an edge-light type light source substrate in accordance with the present invention.

FIG. 5 is a view schematically illustrating a configuration of a surface light source device 50 in accordance with Embodiment 3 of the present invention. The surface light source device 50 of Embodiment 3 is similar to the surface light source devices 10 and 30, except for arrangements of respective LED light source substrates.

Specifically, according to the surface light source device 50 of Embodiment 3, an LED light source substrate 140a is provided in a left end part of an upper side of a light guide plate 120, and an LED light source substrate 140b is provided in a right end part of a lower side of the light guide plate 120 (see FIG. 5). That is, the surface light source device 50 of Embodiment 3 is configured such that the LED light source substrates are provided on a respective pair of long sides of the light guide plate 120.

(a) through (c) of FIG. 6 are views each illustrating a range which is irradiated with light emitted from each of the LED light source substrates of the surface light source device 50 in accordance with Embodiment 3 of the present invention. (a) of FIG. 6 illustrates a range 210a which is irradiated with light emitted from the LED light source substrate 140a. (b) of FIG. 6 illustrates a range 210b which is irradiated with light emitted from the LED light source substrate 140b. (c) of FIG. 6 illustrates ranges which are irradiated with light emitted from the respective LED light source substrates 140a and 140b.

According to the surface light source device 50 of Embodiment 3, the light emitted from the LED light source substrate 140a travels towards a lower side of the light guide plate 120. The range 210a has a spread which is at a refraction angle α with a direction where a right side of the light guide plate 120 extends (see (a) of FIG. 6). This causes a dark part 212a, which is not irradiated with light emitted from the LED light source substrate 140a, to be formed in an upper right corner part of the light guide plate 120.

According to the surface light source device 50 of Embodiment 3, the light emitted from the LED light source substrate 140b travels towards an upper side of the light guide plate 120. The range 210b has a spread which is at a refraction angle α with a direction where a left side of the light guide plate 120 extends (see (b) of FIG. 6). This causes a dark part 212b, which is not irradiated with light emitted from the LED light source substrate 140b, to be formed in a lower left corner part of the light guide plate 120.

According to the surface light source device 50 of Embodiment 3, while only the LED light source substrate 140a is being turned on, the dark part 212a occurs (see (a) of FIG. 6), whereas while only the LED light source substrate 140b is being turned on, the dark part 212b occurs (see (b) of FIG. 6). In contrast, while the LED light source substrates 140a and 140b are both being turned on in the light guide plate 120, the dark part 212a and the dark part 212b are compensated by the range 210b and the range 210a, respectively. It follows that an entire region of the light guide plate 120 becomes a range which is irradiated with light (see (c) of FIG. 6).

That is, the surface light source device 50 of Embodiment 3 also employs the LED light source substrates whose light emitting parts each have a distinctly short length. Note, however, that the aforementioned devised arrangements of the respective LED light source substrates make it possible for the light guide plate 120 to have a sufficient range which is irradiated with light.

The entire region of the light guide plate 120 can become the range which is irradiated with light in a case where (i) the LED light source substrate is provided on the long side of the light guide plate 120 and (ii) the following Equation (3) is satisfied, as with Equation (2) discussed in Embodiment 1, where (i) x indicates the length of the long side of the light guide plate 120, (ii) y indicates the length of the short side of the light guide plate 120, and (iii) L indicates a sum total of the lengths of the respective LED light source substrate 140a and the LED light source substrate 140b.

$$L+y/\sqrt{(\lambda^2-1)} \geq x \quad (3)$$

For example, in a case where (i) an acrylic resin ($\lambda$=1.49) is employed as a material of the light guide plate 120, (ii) an aspect ratio of the light guide plate 120 is 9:16, which is generally employed in a liquid crystal television or the like, and (iii) Equation (4) is satisfied, the entire region of the light guide plate 120 can become the range which is irradiated with light.

$$L \geq 0.49x \quad (4)$$

That is, in a case where the sum total of the lengths of the respective light source substrate 140a and light source substrate 140b exceeds 0.49 times of the length of the long side of the light guide plate 120, the entire region of the light guide plate 120 can become the range which is irradiated with light.

According to the surface light source device 50 of Embodiment 3, the LED light source substrate is provided along the long side of the light guide plate. This causes a distance to be relatively short that light emitted from the LED light source substrate travels during passing through the light guide plate and being then emitted from a surface, which is irradiated with light, of the light guide plate. This causes an amount of light absorbed by the light guide plate to be relatively small, so as to allow an increase in light emission efficiency.

[Embodiment 4]

Figure 7:
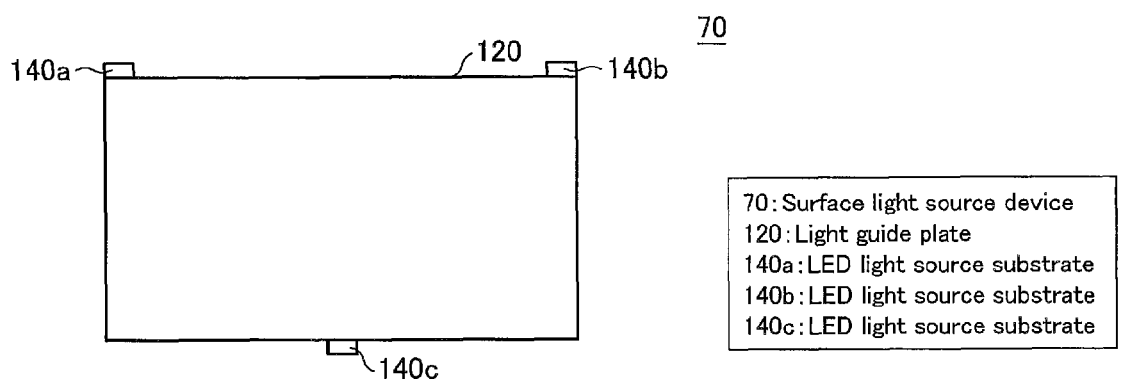
FIG. 7 is a view schematically illustrating a configuration of a surface light source device in accordance with Embodiment 4 of the present invention.
Figure 8:
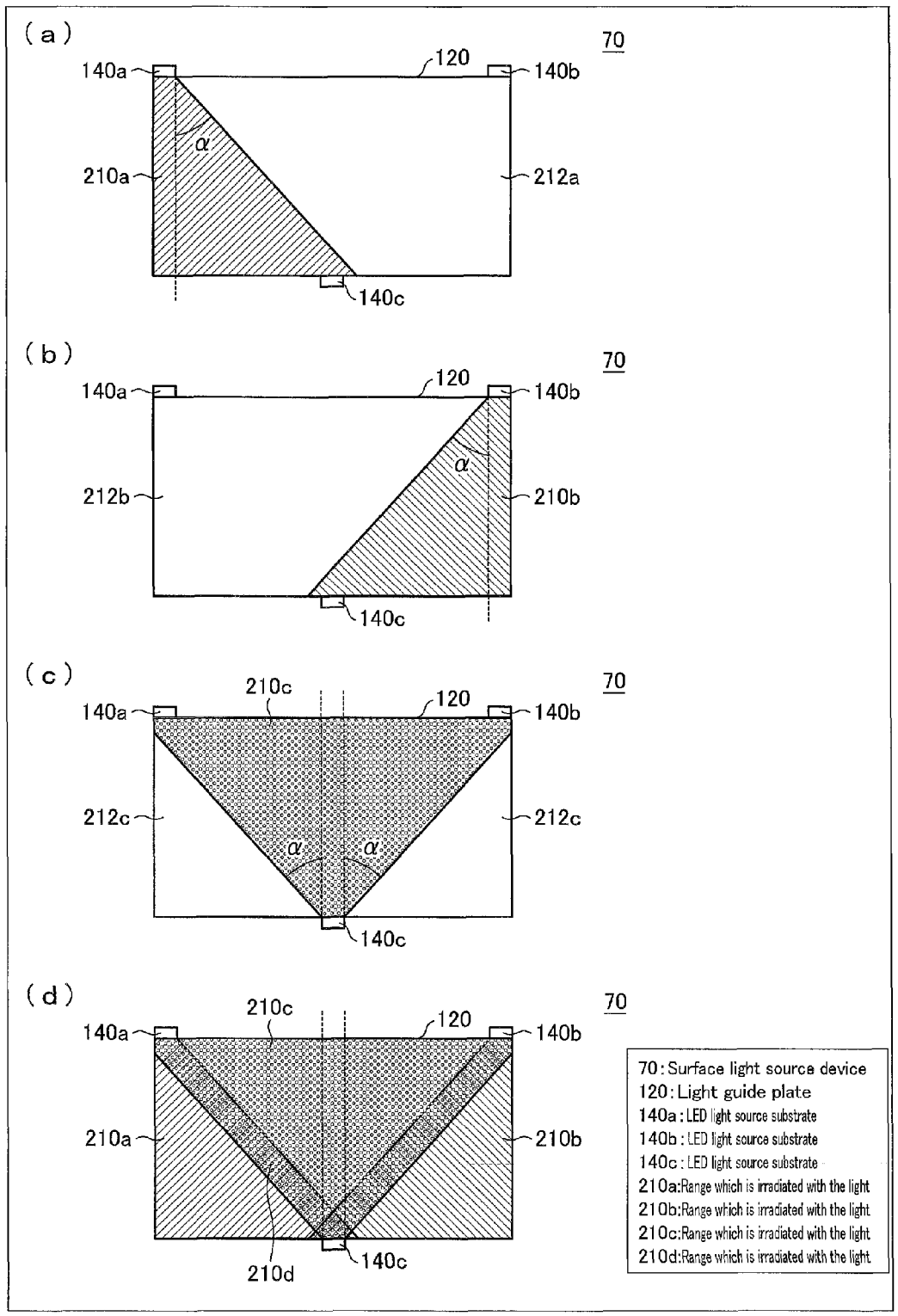
FIGS. 8(a)-8(d) are a view illustrating a range which is irradiated with light emitted from each of LED light source substrates of the surface light source device in accordance with Embodiment 4 of the present invention.

The following description will discuss, with reference to FIGS. 7 and 8, a surface light source device 70 of Embodiment 4, which is an example of an edge-light type light source substrate in accordance with the present invention.

FIG. 7 is a view schematically illustrating a configuration of a surface light source device 70 in accordance with Embodiment 4 of the present invention. The surface light source device 70 of Embodiment 4 is similar to the surface light source devices 10, 30, and 50, except for arrangements of respective LED light source substrates.

Specifically, the surface light source device 70 of Embodiment 4 includes, as LED light source substrates, an LED light source substrate 140a, an LED light source substrate 140b, and an LED light source substrate 140c (see FIG. 7).

The LED light source substrate 140a is provided in a left end part of an upper side of a light guide plate 120, the LED light source substrate 140b is provided in a right end part of the upper side of the light guide plate 120, and the LED light source substrate 140c is provided in a center part of a lower side of the light guide plate 120

That is, the surface light source device 70 of Embodiment 4 differs from the aforementioned surface light source devices 10, 30, and 50 in that the surface light source device 70 is configured such that (i) three LED light source substrates are provided and (ii) two of the three LED light source substrates are provided to a long side (the upper side) of the light guide plate 120.

(a) through (d) of FIG. 8 are views each illustrating a range which is irradiated with light emitted from each of the LED light source substrates of the surface light source device 70 in accordance with Embodiment 4 of the present invention. (a) of FIG. 8 illustrates a range 210a which is irradiated with light emitted from the LED light source substrate 140a. (b) of FIG. 8 illustrates a range 210b which is irradiated with light emitted from the LED light source substrate 140b. (c) of FIG. 8 illustrates a range 210c which is irradiated with light emitted from the LED light source substrate 140c. (d) of FIG. 8 illustrates ranges which are irradiated with light emitted from the respective LED light source substrates 140a, 140b, and 140c.

According to the surface light source device 70 of Embodiment 4, the light emitted from the LED light source substrate 140a travels towards a lower side of the light guide plate 120. The range 210a has a spread which is at a refraction angle $\alpha$ with a direction where a right side of the light guide plate 120 extends (see (a) of FIG. 8). This causes a dark part 212a, which is not irradiated with light emitted from the LED light source substrate 140a, to be formed in mainly an upper right corner part of the light guide plate 120.

According to the surface light source device 70 of Embodiment 4, the light emitted from the LED light source substrate 140b travels towards the lower side of the light guide plate 120. The range 210b has a spread which is at a refraction angle $\alpha$ with a direction where a left side of the light guide plate 120 extends (see (b) of FIG. 8). This causes a dark part 212b, which is not irradiated with light emitted from the LED light source substrate 140b, to be formed in mainly an upper left corner part of the light guide plate 120.

According to the surface light source device 70 of Embodiment 4, the light emitted from the LED light source substrate 140c travels towards an upper side of the light guide plate 120. The range 210c has (i) a spread which is at a refraction angle $\alpha$ with a direction where the left side of the light guide plate 120 extends and (ii) a spread which is at a refraction angle $\alpha$ with a direction where the right side of the light guide plate 120 extends (see (c) of FIG. 8). This causes dark parts 212c, which are not irradiated with light emitted from the LED light source substrate 140b, to be formed in respective of a lower left corner part and a lower right corner part of the light guide plate 120.

According to the surface light source device 70 of Embodiment 4, while only the LED light source substrate 140a is being turned on, the dark part 212a occurs (see (a) of FIG. 8). While only the LED light source substrate 140b is being turned on, the dark part 212b occurs (see (b) of FIG. 8). While only the LED light source substrate 140c is being turned on, the dark parts 212c occur (see (c) of FIG. 8). In contrast, while the LED light source substrates 140a, 140b, and 140c are all being turned on in the light guide plate 120, (i) the dark part 212a is compensated by the ranges 210b and 210c, (ii) the dark part 212b is compensated by the ranges 210a and 210c, and (iii) the dark parts 212c are compensated by the ranges 210a and 210b. It follows that an entire region of the light guide plate 120 becomes a range which is irradiated with light (see (d) of FIG. 8).

That is, the surface light source device 70 of Embodiment 4 also employs the LED light source substrates whose light emitting parts each have a distinctly short length. Note, however, that the aforementioned devised (i) number of the LED light source substrates and (ii) arrangements of the respective LED light source substrates make it possible for the light guide plate 120 to have a sufficient range which is irradiated with light.

Particularly, according to the surface light source device 70 of Embodiment 4, the LED light source substrates are each properly arranged in view of a shape of the spread of light emitted from each of the LED light source substrates. This makes it possible for the light guide plate 120 to have a sufficient range which is irradiated with light, even though only three LED light source substrates are employed whose light emitting parts each have a distinctly short length. That is, according to the surface light source device 70 of Embodiment 4, as compared with the surface light source device 50 of Embodiment 3, one more LED light source substrate needs to be provided, but it is possible to employ LED light source substrates whose lengths are distinctly short.

This effect is clear when FIG. 8, which illustrates the ranges, which are irradiated with light, of the surface light source device 70, are compared with FIG. 6, which indicates the ranges, which are irradiated with light, of the surface light source device 50. The following discussion will also clarify this effect.

In a case where (i) N LED light source substrates are provided on the long side of the light guide plate 120 and (ii) the entire region of the light guide plate 120 becomes a range which is irradiated with light, the following Equation (5) needs to be satisfied, as with Equation (2) discussed in Embodiment 1.

$$L+(N-1)y/\sqrt{(\lambda^2-1)} \geq x \quad (5)$$

The following description will discuss, for example, a case where (i) an acrylic resin ($\lambda$=1.49) is employed as a material of the light guide plate 120 and (ii) an aspect ratio of the light guide plate 120 is 9:16.

In a case of the surface light source device 50 of Embodiment 3, N is equal to 2. In a case where L is equal to 0, Equation (5) is not satisfied. That is, there is a limit to a reduction in sum total of the lengths of the respective LED light source substrates.

On the other hand, in a case of the surface light source device 50 of Embodiment 4, N is equal to 3. Even in a case where L is equal to 0, Equation (5) is satisfied. That is, there is no limit to a reduction in the sum total of the lengths of the respective LED light source substrates.

[Embodiment 5]

Figure 9:
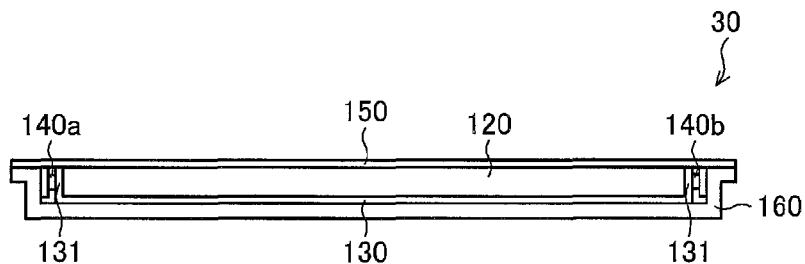
FIG. 9 is a cross sectional view illustrating a configuration of a surface light source device in accordance with Embodiment 5 of the present invention.
Figure 10:
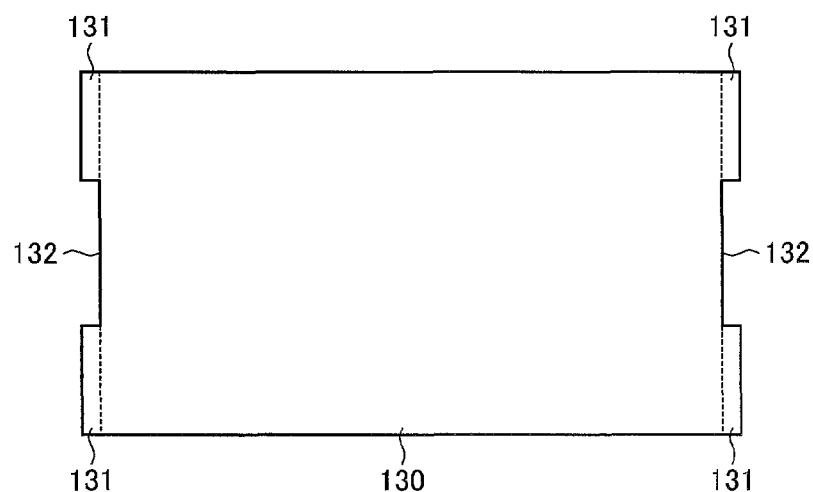
FIG. 10 is a view illustrating arrangements of respective of (i) a reflecting sheet and (ii) reflecting members which are included in the surface light source device in accordance with Embodiment 5 of the present invention.
Figure 11:
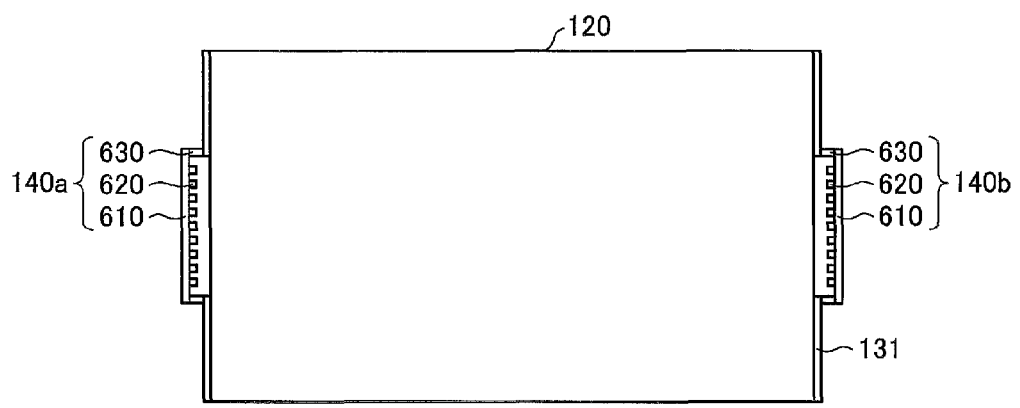
FIG. 11 is a view illustrating a configuration of a lateral part of a light guide plate of the surface light source device in accordance with Embodiment 5 of the present invention.

The following description will discuss Embodiment 5 of the present invention with reference to FIGS. 9 through 11.

The edge-light type surface light source device 30 discussed in Embodiment 2 is configured such that the LED light source substrates are provided in the center parts of the respective short side of the light guide plate 120. This may cause a problem that luminances in the respective corner parts of the light guide plate 120 are lower than a luminance in a part other than the corner parts.

In order to address such a problem, Embodiment 5 deals with, by use of the surface light source device 30 of Embodiment 2, an example of a configuration in which luminances in the respective corner parts of the light guide plate 120 are increased.

FIG. 9 is a cross sectional view illustrating a configuration of a surface light source device 30 in accordance with Embodiment 5 of the present invention.

Figure 15:
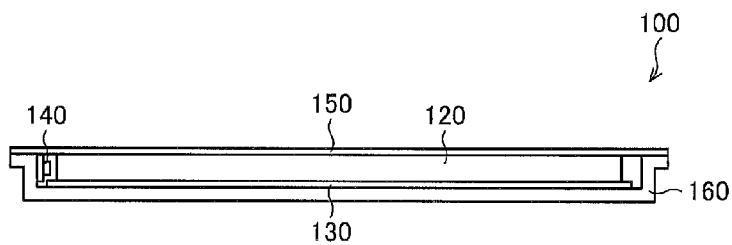
FIG. 15 is a cross sectional view illustrating the conventional edge-light type surface light source device illustrated in FIG. 14, which the conventional edge-light type surface light source device has been assembled.
Figure 16:
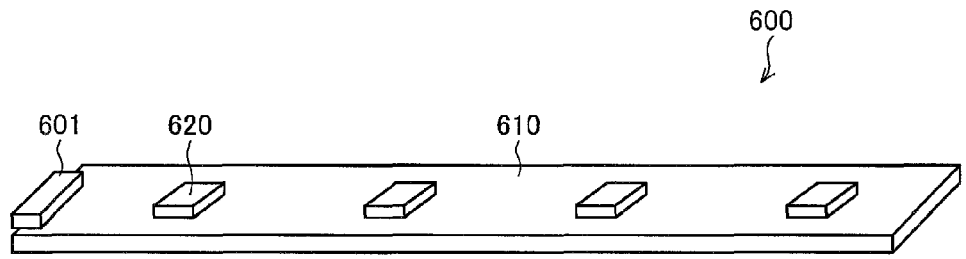
FIG. 16 is an external view illustrating an LED light source substrate of a conventional edge-light type surface light source device.
Figure 17:
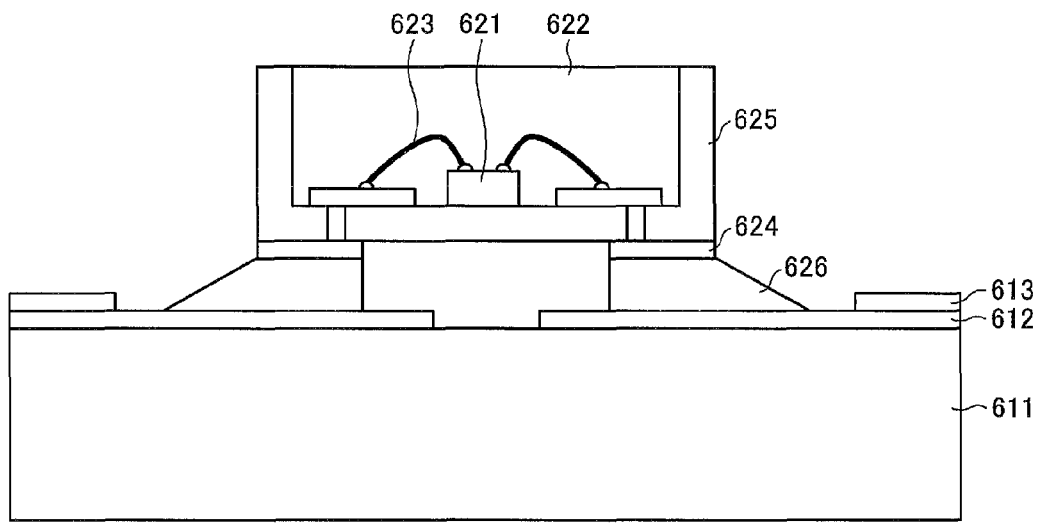
FIG. 17 is a cross sectional view illustrating the LED light source substrate illustrated in FIG. 16.
Figure 18:
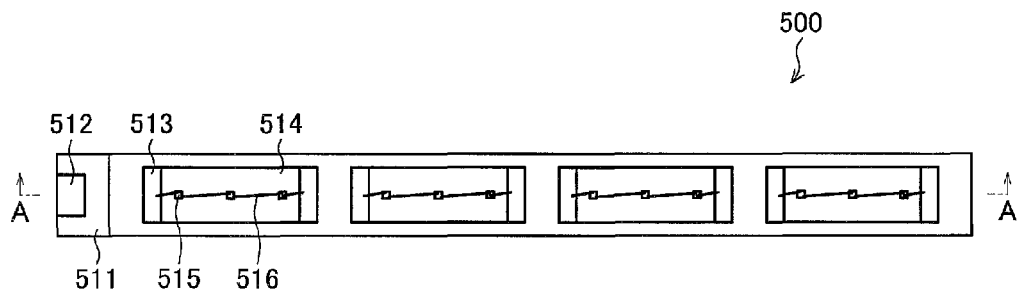
FIG. 18 is a view illustrating another example of an LED light source substrate of a conventional edge-light type surface light source device.
Figure 19:
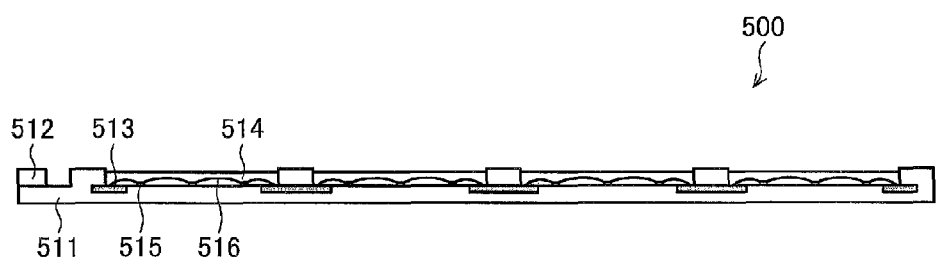
FIG. 19 is a cross-sectional view, taken on A-A line of FIG. 18, illustrating the LED light source substrate.

As is clear from the comparison in configuration between FIG. 9 and FIG. 15, the conventional edge-light type surface light source device is configured such that the LED light source substrate is provided only one of the short sides of the light guide plate 120, whereas the surface light source device 30 of Embodiment 5 is configured such that LED light source substrates are provided on both of respective short sides of the light guide plate 120.

The surface light source device 30 of Embodiment 5 is configured such that reflecting members 131 are provided on both of the respective short sides of the light guide plate 120, whereas the conventional edge-light type surface light source device is configured such that no such reflecting member is provided.

FIG. 10 is a view illustrating arrangements of respective of (i) a reflecting sheet 130 and (ii) the reflecting members 131 which are included in the surface light source device 30 in accordance with Embodiment 5 of the present invention.

The reflecting members 131 are provided so as to be integrated with the reflecting sheet 130 of the surface light source device 30 (see FIG. 10). Specifically, the reflecting sheet 130 has a pair of short sides each having parts with a certain degree of width, which parts extending along a corresponding one the pair of short sides. Such parts each serve as a reflecting member 131.

Each reflecting member 131 is vertically folded along a boundary line (a broken line illustrated in FIG. 9) between (i) the each reflecting member 131 and (ii) the reflecting sheet 130 (see FIG. 9). This allows the reflecting members 131 to cover side surfaces of the light guide plate 120. For this reason, the reflecting members 131 have a width sufficient to cover the side surfaces of the light guide plate 120. Perforation processing, half-cut processing, compression processing, or the like is carried out with respect to the parts of the boundary lines so that the reflecting members 131 can be easily and securely folded.

Particularly, the reflecting members 131 are provided in both end parts of each of the pair of short sides of the reflecting sheet 130. For example, a material having a total luminous reflectance of approximately not less than 70% is employed as a material of each reflecting member 131. According to the surface light source device 30 of Embodiment 5, side surfaces, including all corner parts, of the respective short sides of the light guide plate 120 are thus covered with the reflecting members 131. This makes it possible to increase luminances in the respective corner parts.

The reflecting sheet 130 has, in center parts of the respective pair of short sides, notched parts 132 each of which includes no reflecting member 131. The notched parts 132 are provided so as to prevent light emitted from the LED light source substrates from being blocked. Accordingly, it is preferable that the notched parts 132 each have a length which is at least longer than a length of each of light emitting parts of the respective LED light source substrates.

Note that, in a case where the light emitted from the LED light source substrates is not blocked, the reflecting sheet 130 can be configured not to have notched parts 132. For example, the reflecting sheet 130 can be configured to have opening parts, instead of the notched parts 132. This allows the light emitted from the LED light source substrates not to be blocked.

Instead of the notched parts or opening parts, a configuration can be alternatively employed in which (i) a reflecting member 131 is provided so as to entirely cover side surfaces of a light guide plate 120 and (ii) LED light source substrates are provided between the reflecting member 131 and the light guide plate 120. With the configuration, it is possible for light emitted from the LED light source substrates not to be blocked. According to the alternative configuration, it is possible to (i) simplify the configuration of the reflecting member 131 or (ii) reduce the number of components of the respective reflecting members 131.

Note that, in a case where the reflecting members 131 need to have a reflectance lower than that of the reflecting sheet 130, this can be easily achieved by, for example, applying a black paint onto surfaces of the respective reflecting members 131.

According to Embodiment 5, the reflecting members 131 are provided so that a reflectance is increased in a given part of the light guide plate 120 (reflectances are increased in the respective corner parts of the light guide plate 120 in the example illustrated in FIG. 10). Note, however, that the surface light source device 30 can be alternatively configured such that a reflectance is increased in a given part of the light guide plate 120 by, for example, (i) applying a white paint onto a side surface of the light guide plate 120 or (ii) depositing a metal, such as silver, which has a high reflectance on the side surface of the light guide plate 120. In these cases, it is possible to easily realize a function similar to functions of the reflecting members 131.

In contrast, the surface light source device 30 can be configured, as needed, such that a reflectance is reduced in a given part of the light guide plate 120. For example, the surface light source device 30 can be configured such that a material having a low reflectance is provided on, is applied onto, or is deposited on the side surface of the light guide plate 120 so that the reflectance is reduced in the given part of the light guide plate 120. Examples of such a material encompass a material, such as a resin and a paint in each of which a carbon black is blended, which (i) is normally recognizable to have a black color and (ii) has a total luminous reflectance of not more than approximately 10%.

FIG. 11 is a view illustrating a configuration of a lateral part of the light guide plate 120 of the surface light source device 30 in accordance with Embodiment 5 of the present invention. FIG. 11 illustrates a state in which the light guide plate 120, the reflecting sheet 130, the reflecting member 131, an LED light source substrate 140a, and an LED light source substrate 140b are combined with each other.

The LED light source substrate 140a and the LED light source substrate 140b each include a wiring substrate 610, an LED package 620, and a reflecting sheet fixing member 630 (see FIG. 11). The reflecting sheet fixing member 630 (i) is provided so as to project from the wiring substrate 610 toward a side of the light guide plate 120 and (ii) presses a reflecting member 131 against the light guide plate 120. This (i) eliminates the necessity of separately providing a member for fixing the reflecting member 131 in the surface light source device 30 of Embodiment 5 and (ii) makes it easy to fix the reflecting member 131 in the surface light source device 30 of Embodiment 5.

Note that the reflecting sheet fixing member 630 can be provided so as to be integrated with the wiring substrate 610. Particularly, in Embodiment 5, it is possible to provide an LED element on a wiring substrate by use of the COB technique, instead of employing the LED packages as the LED light source substrate 140a and the LED light source substrate 140b. In this case, by subjecting the wiring substrate to injection molding, it is possible to easily carry out integral molding with respect to the wiring substrate and the reflecting sheet fixing member.

[Embodiment 6]

Figure 12:
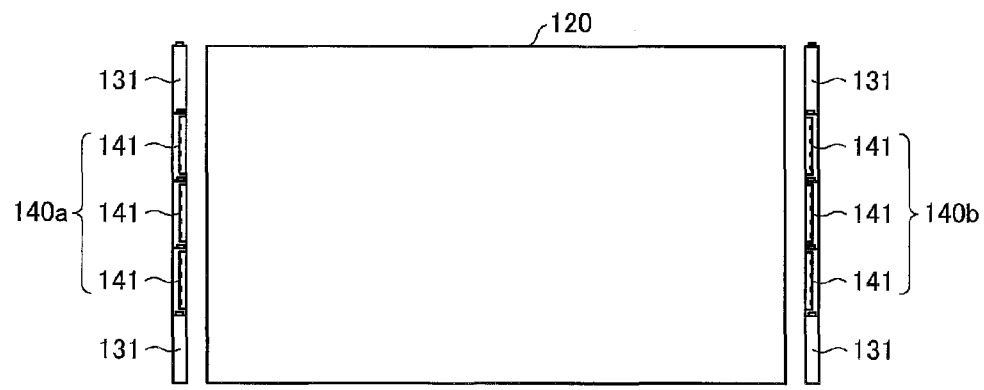
FIG. 12 is a view illustrating a configuration of a lateral part of a light guide plate of a surface light source device in accordance with Embodiment 6 of the present invention.

The following description will discuss Embodiment 6 of the present invention with reference to FIG. 12. Embodiment 6 deals with an example in which a plurality of small substrates 141 are connected to each other so as to constitute an LED light source substrate 140.

FIG. 12 is a view illustrating a configuration of a lateral part of a light guide plate 120 of a surface light source device 30 in accordance with Embodiment 6 of the present invention. FIG. 12 specifically illustrates an arrangement of a part of the surface light source device 30 in accordance with Embodiment 2. FIG. 12 illustrates a state in which the light guide plate 120, a reflecting sheet 130, reflecting members 131, an LED light source substrate 140a, and an LED light source substrate 140b are combined with each other.

The light source substrate 140a and the light source substrate 140b are each configured such that a plurality of (three in the example illustrated in FIG. 12) small substrates 141 are connected to each other (see FIG. 12). The plurality of small substrates 141 are configured to be mechanically and electrically connectable to each other. By connecting the plurality of small substrates 141 to each other, the plurality of small substrates 141 thus connected can be equally treated as a single light source substrate. The reflecting members 131 are also configured to be mechanically connectable to the small substrates 141.

Connected parts can be configured by use of any well-known configuration. Example of such a configuration encompass a configuration in which a convex part of one member is engaged with a concave part of another member so that both of the members are connected to each other.

As has been described, the surface light source device 30 of Embodiment 6 is configured such that the reflecting members 131 are connected to respective both ends of each of the LED light source substrates 140a and 140b. This makes it possible to adjust reflectances of side surfaces of the light guide plate 120, on which side surfaces no LED light source substrate is provided. This allows the surface light source device 30 of Embodiment 6 to bring about an effect similar to that of the surface light source device 30 of Embodiment 5. Particularly, since the reflecting members 131 which are detachable are employed in the surface light source device 30 of Embodiment 6, the reflectances can be easily changed.

The aforementioned description has been discussed the example in which the reflecting member 131 is provided so as to be integrated with the reflecting sheet 130. Note, however, that the configuration of the reflecting member 131 is not limited to this. That is, the reflecting member 131 can be provided as a single member. In this case, it is possible to fix a position of the reflecting member 131, by adhering the reflecting member 131 to the light guide plate 120 via an adhesive member such as an adhesive and a tape.

[Embodiment 7]

Figure 13:
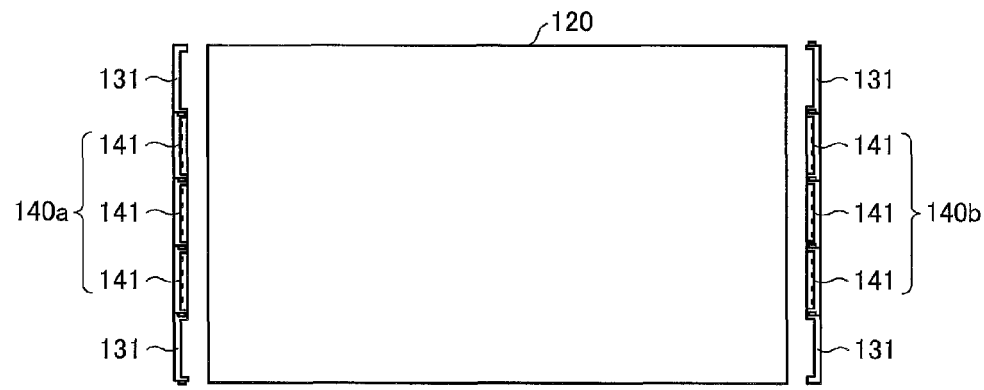
FIG. 13 is a view illustrating a configuration of a lateral part of a light guide plate of a surface light source device in accordance with Embodiment 7 of the present invention.
Figure 14:
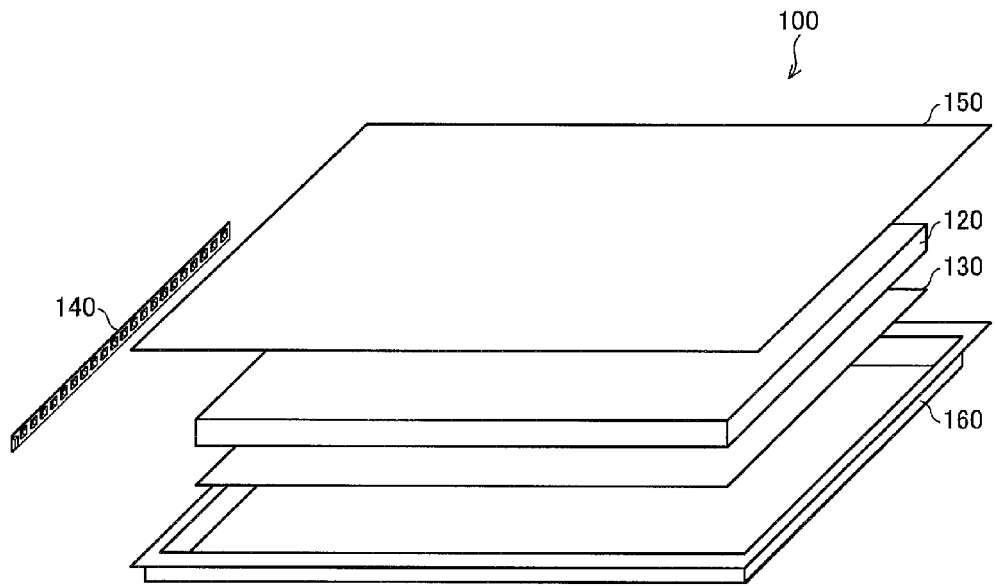
FIG. 14 is an exploded perspective view illustrating a configuration of a conventional edge-light type surface light source device.

The following description will discuss Embodiment 7 of the present invention with reference to FIG. 13. FIG. 13 is a view illustrating a configuration of a lateral part of a light guide plate 120 of a surface light source device 30 in accordance with Embodiment 7 of the present invention.

According to Embodiment 7, a reflecting member 131 has a shape which is different from that of the reflecting member 131 of Embodiment 6. Specifically, according to Embodiment 7, a substrate part of a small substrate 141 is employed as the reflecting member 131.

This makes it possible to (i) employ the substrate part of the small substrate 141, as it is, as the reflecting member 131 of Embodiment 7. Reflecting members 131 of Embodiment 7 are connectable to each other, as with small substrates 141. This allows the reflecting member 131 of Embodiment 7 to ensure performance and reliability similar to those of the small substrate 141, in terms of its structure and strength. Since it is unnecessary to employ an exclusive part as the reflecting member 131, a cost required for the reflecting member 131 can be reduced.

Particularly, a material having a high reflectance is employed as the substrate part of the small substrate 141 so that light is effectively utilized. Accordingly, the substrate part of the small substrate 141 can be employed, as it is, as the reflecting member 131 having a high reflectance, instead of carrying out special processing.

[Supplementary Explanation]

According to the Embodiments, LED light source substrates are each employed as a light source. Note, however, that the light source is not limited to this. As illustrated in the Embodiments, in a case where the LED light source substrate is employed as the light source, it is possible to realize a luminance equivalent to those of the other light source substrates, even though such an LED light source substrate is shorter than the other light source substrates.

Particularly, in a case where the LED light source substrate is employed as the light source, it is possible to easily adjust a luminance in a given part of the light guide plate 120, by adjusting the number of LED elements and an arrangement of the LED elements (positions of the respective LED elements and an interval between the respective LED elements). For example, in a case of increasing a luminance in an end part of the short side of the light guide plate 120, such an increase can be easily achieved by arranging the LED elements so that an interval between the respective LED elements is short in the end part.

In the Embodiments, the LED elements are mounted on the LED light source substrate by use of an LED packaging. Note, however, it is more preferable to mount the LED elements on the LED light source substrate by use of the COB technique, due to the following reasons (1) through (3). (1) According to the mounting of the LED package on a wiring substrate, a certain degree of length is necessary for (i) the LED packaging and (ii) soldering of the LED packaging on the wiring substrate. This causes a reduction in the number of LED elements which can be mounted per a certain length. Accordingly, the COB technique is suitable for mounting the larger number of LED elements in a high density. (2) In a case where the COB technique is employed, the LED elements can be mounted instead of using the solder. This makes it possible to use a larger amount of electric power without being bounded by temperature of the solder. That is, since a temperature rise is acceptable, it is possible to apply a large electric current. This allows a luminance of an LED element to be increased, as compared with a case where such an LED element is bounded by temperature. (3) In a case where substrates, for which the COB technique is employed, are created by injection molding, it is possible to easily realize a connectable configuration, as described in Embodiments 6 and 7.

[Application]

Figure 26:
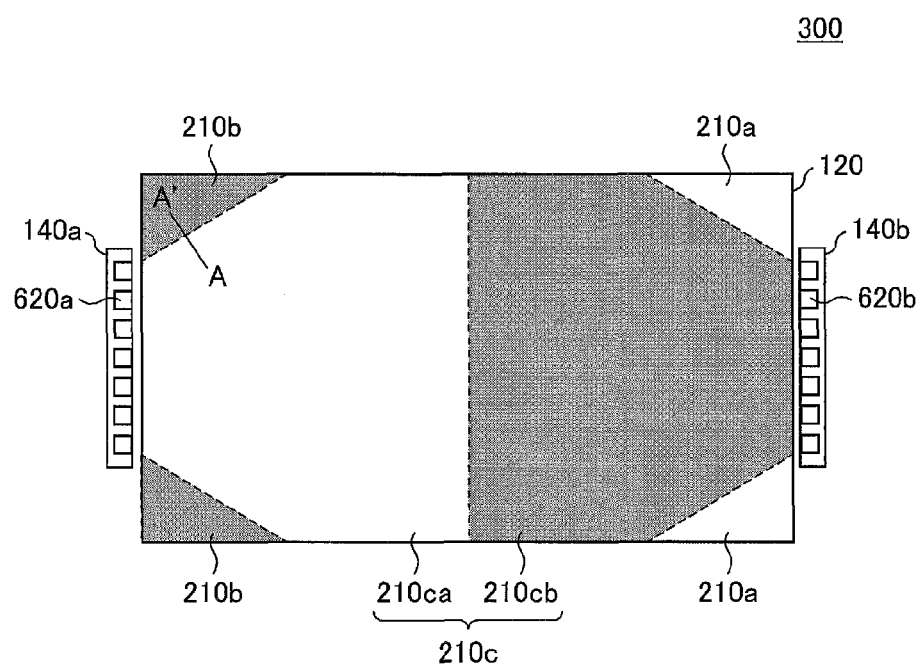
FIG. 26 is a view illustrating a schematic configuration of a surface light source device in accordance with an application of the present invention and how light is irradiated.

The following description will discuss an application of the Embodiments with reference to (a) through (c) of FIG. 4 and FIG. 26.

FIG. 26 is a view illustrating (i) a schematic configuration of a surface light source device in accordance with this application and (ii) how light is irradiated.

According to the surface light source device 30 illustrated in each of (a) through (c) of FIG. 4, the dark part 212a, which is not irradiated with the light emitted from the LED light source substrate 140a, is irradiated with the light emitted from the LED light source substrate 140b, whereas the dark part 212b, which is not irradiated with the light emitted from the LED light source substrate 140b, is irradiated with the light emitted from the LED light source substrate 140a. This makes it possible to realize an arrangement in which light is exited via an entire surface, which is irradiated with light, of the light guide plate 120.

The following description will discuss a method of unifomizing a brightness of light exited via the entire surface, which is irradiated with light, of the light guide plate 120.

FIG. 26 illustrates a surface light source device 300, which is an application of the surface light source device 30. In a range illustrated in FIG. 26, the surface light source device 300 includes members identical to those of the surface light source device 30.

FIG. 26 further illustrates (i) LED packages (point light sources, light emitting diodes) 620a included in an LED light source substrate 140a and (ii) LED packages 620b included in an LED light source substrate 140b. The LED package 620 is made up of the LED packages 620a and the LED packages 620b. The LED light source substrate 140a is arranged to extend along a left side of a light guide plate 120. A plurality of LED packages 620a (FIG. 26 illustrates seven LED packages 620a, but the number of LED packages 620a is not limited to this) are provided in line in a direction in which the LED light source substrate 140a extends. Similarly, the LED light source substrate 140b is arranged to extend along a right side of the light guide plate 120. A plurality of LED packages 620b (FIG. 26 illustrates seven LED packages 620b, but the number of LED packages 620b is not limited to this) are provided in line in a direction in which the LED light source substrate 140b extends.

According to FIG. 26, a range 210c which is irradiated with light is divided into (i) a range 210ca which is mainly irradiated with light emitted from the LED light source substrate 140a and (ii) a range 210cb which is mainly irradiated with light emitted from the LED light source substrate 140b. It follows that the ranges 210a and 210ca (white color parts in a surface, which is irradiated with light, of the light guide plate 120) are mainly irradiated with the light emitted from the LED light source substrate 140a. On the other hand, the ranges 210b and 210cb (gray color parts in the surface, which is irradiated with light, of the light guide plate 120) are mainly irradiated with the light emitted from the LED light source substrate 140b.

In a case where light exited via the white color part has a luminance identical to that of light exited from the gray color part, it would appear to be possible to uniformize a brightness of light exited from the entire surface, which is irradiated with light, of the light guide plate 120. The light exited from the white color part can have a luminance identical to that of the light exited from the gray color part as follows. That is, on the entire surface, which is irradiated with light, of the light guide plate 120, (i) a luminance distribution caused by the light emitted from the LED light source substrate 140a and (ii) a luminance distribution caused by the light emitted from the LED light source substrate 140b have a relation in which their phases are opposite to each other.

Note here that opposite phases indicate a state in which a luminance distribution (large and small of luminance) of one of two types of light with which a single region is irradiated, is substantially opposite to a luminance distribution (large and small of luminance) of the other one of the two types of light. In other words, on the entire surface, which is irradiated with light, of the light guide plate 120, the luminance distribution caused by the light emitted from the LED light source substrate 140a is substantially opposite, in large and small of luminance, to the luminance distribution caused by the light emitted from the LED light source substrate 140b.

Figure 20:
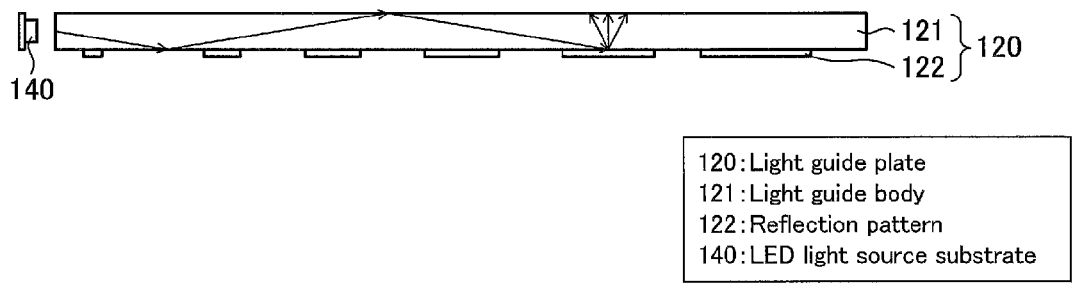
FIG. 20 is a view illustrating a reflection pattern of light observed in a case of a conventional edge-light type surface light source device.
Figure 21:
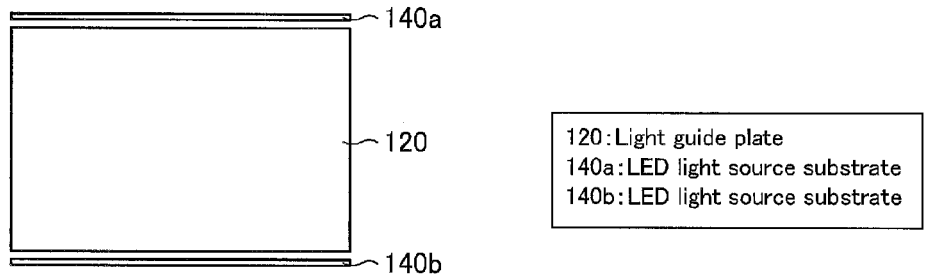
FIG. 21 is a view schematically illustrating arrangements of respective light source substrates of a conventional edge-light type surface light source device.
Figure 22:
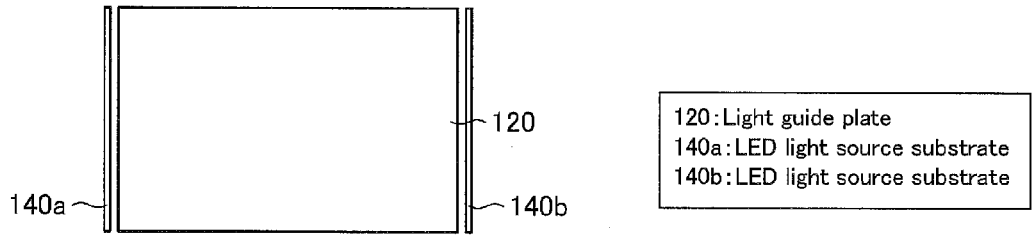
FIG. 22 is a view schematically illustrating arrangements of respective light source substrates of a conventional edge-light type surface light source device.
Figure 23:
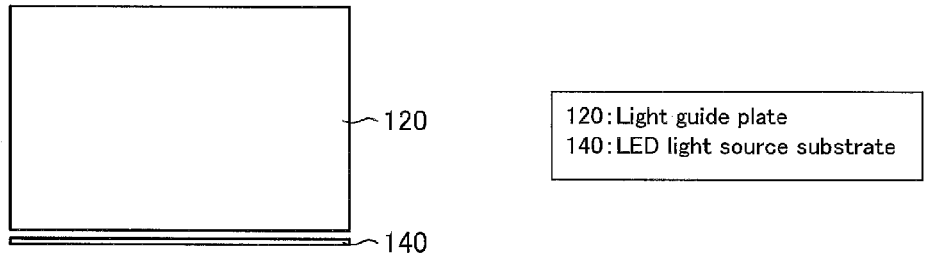
FIG. 23 is a view schematically illustrating an arrangement of a light source substrate of a conventional edge-light type surface light source device.
Figure 24:
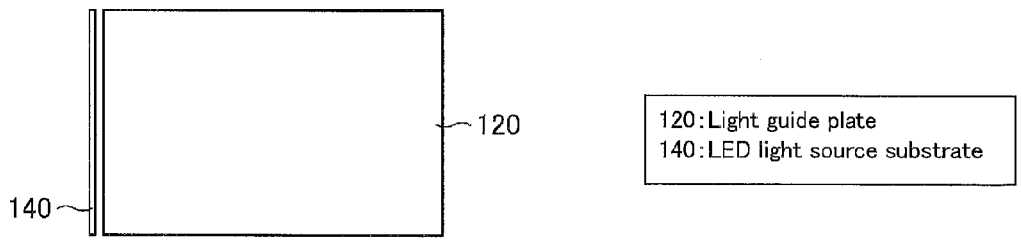
FIG. 24 is a view schematically illustrating an arrangement of a light source substrate of a conventional edge-light type surface light source device.

Note that it is easy to obtain desired plane light emitting pattern by properly setting the reflection pattern 122 (see FIG. 20) in the light guide plate 120. Accordingly, it is technically easy to realize an arrangement having the aforementioned relation in which phases are opposite to each other.

Figure 27I:
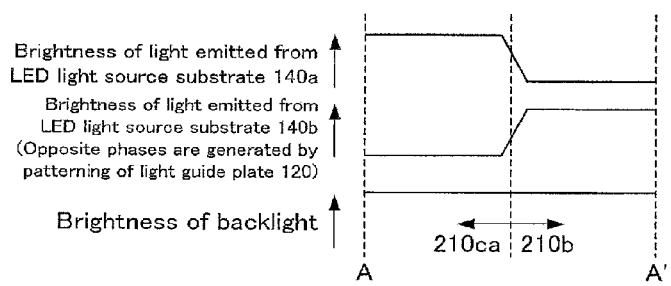
FIG. 27 (i) is a view illustrating waveforms indicating brightnesses of light emitted from respective LED light source substrates of a surface light source device in accordance with an application of the present invention and (ii) illustrates a relation in brightnesses between A and A' illustrated in FIG. 26.
Figure 27:
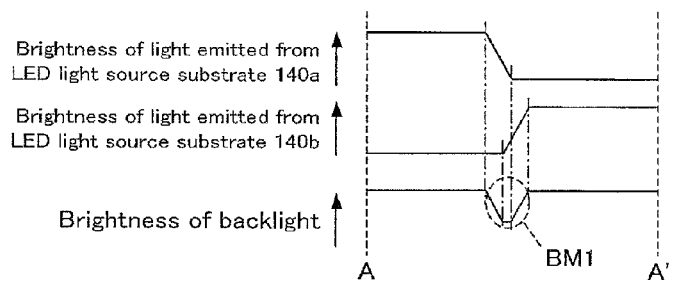

The following description will discuss, with reference to FIGS. 26 and 27, points to be noted in a case of realizing the arrangement having the aforementioned relation in which phases are opposite to each other.

FIG. 27 is a view illustrating waveforms indicating brightnesses of light emitted from the respective LED light source substrate 140*a* and LED light source substrate 140*b* of the surface light source device 300 (application). FIG. 27 illustrates a relation in brigtnesses between A and A' illustrated in FIG. 26.

According to FIG. 27, in a case where an arrangement having the aforementioned relation is realized, a brightness (luminance) caused by the light emitted from the LED light source substrate 140*a* is high in the range 210*ca* (the white color part), whereas the brightness (luminance) caused by the light emitted from the LED light source substrate 140*a* is low in the range 210*b* (the gray color part). In this case, in contrast, a brightness caused by the light emitted from the LED light source substrate 140*b* is low in the range 210*ca*, whereas the brightness caused by the light emitted from the LED light source substrate 140*b* is high in the range 210*b*. The same applies to the range 210*cb* (the gray color part) and the range 210*a* (the white color part). Accordingly, the surface light source device 300 achieves having an entire surface, which is uniformly irradiated with light, of the light guide plate 120. This is illustrated as a brightness of a backlight in FIG. 27.

It should be noted here that an example illustrated in FIG. 27 is an example case where the LED light source substrate 140*a* and the LED light source substrate 140*b* of the surface light source device 300 each emit light having a substantially uniform luminance on an entire range which is irradiated with light. Note that, in this case, (i) the LED packages 620*a* each normally emit light having a substantially uniform luminance and (ii) the LED packages 620*b* each normally emit light having a substantially uniform luminance.

According to the examples illustrated in FIG. 27, (i) a luminance gradient in a location where the brightness of the light emitted from the LED light source substrate 140*a* changes and (ii) a luminance gradient in a location where the brightness of the light emitted from the LED light source substrate 140*b* changes, are steep at a boundary between the range 210*ca* and the range 210*b*. This is because the entire range, to be irradiated with light, is irradiated with light, having a substantially uniform luminance, emitted from the LED light source substrate 140*a* and the LED light source substrate 140*b*, so that edges of the ranges have respective brightnesses almost identical to those in parts, other than the edges, in the respective ranges.

In a case where neither the LED light source substrate 140*a* nor the LED light source substrate 140*b* has displacement, a part where the brightness of the light emitted from the LED light source substrate 140*a* changes is exactly identical to a part where the brightness of the light emitted from the LED light source substrate 140*b* changes (see a graph illustrated in an upper part of FIG. 27). As a result, the backlight actually has a uniform brightness on the entire surface, which is irradiated with light, of the light guide plate 120.

On the other hand, in a case where the LED light source substrate 140*a* is arranged so as to have a downward displacement due to some reason, a part where the brightness of the light emitted from the LED light source substrate 140*a* changes is not identical to a part where the brightness of the light emitted from the LED light source substrate 140*b* changes (see a graph illustrated in a lower part of FIG. 27). As a result, BM1, which is a part where the brightness of the light emitted from the backlight drops, occurs as a large drop in a narrow range. This triggers nonuniformity of the light, with which the surface, to be irradiated with light, of the light guide plate 120 is irradiated (i.e., this triggers unevenness of luminance). The same applies to (i) a case where the LED light source substrate 140*a* is arranged so as to have a displacement other than the downward displacement and (ii) a case where the LED light source substrate 140*b* is arranged so as to have a displacement.

[Variation of Application]

As discussed with reference to FIG. 27, an LED light source substrate 140*a* and an LED light source substrate 140*b* are each configured, as follows, in order to prevent, from being nonuniform, light with which a surface, to be irradiated with light, of a light guide plate 120 is irradiated. That is, the LED light source substrate 140*a* and the LED light source substrate 140*b* are each configured to emit light having a first luminance gradient on an edge of a range, to be irradiated with light, which first luminance gradient is smaller than a second luminance gradient of light having a substantially uniform luminance on an entire range to be irradiated with light.

This can prevent a luminance in a specific region of the light guide plate 120 from being distinctly reduced due to a displacement of the LED light source substrate 140*a* or the LED light source substrate 140*b*. This makes it possible to obtain a uniform luminance on the entire surface, which is irradiated with light, of the light guide plate 120.

This will be discussed below with reference to FIG. 26 and FIGS. 28 through 30.

Figure 28I:
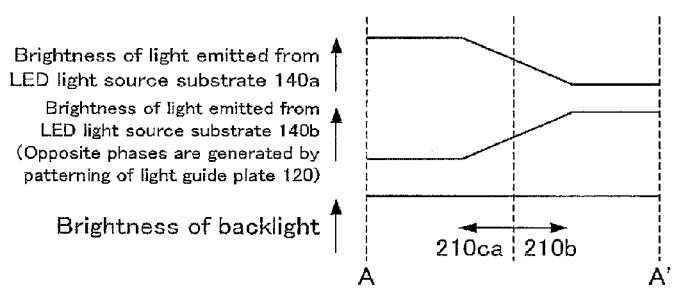
FIG. 28 (i) is a view illustrating waveforms indicating brightnesses of light emitted from respective LED light source substrates of a surface light source device in accordance with a variation of an application of the present invention and (ii) illustrates a relation in brightnesses between A and A' illustrated in FIG. 26.
Figure 28:
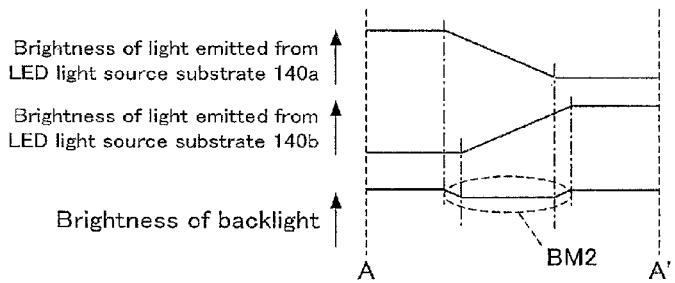

FIG. 28 is a view illustrating waveforms indicating brightnesses of light emitted from the respective LED light source substrate 140*a* and LED light source substrate 140*b* of a surface light source device 300 (variation of application). FIG. 28 illustrates a relation in brigtnesses between A and A' illustrated in FIG. 26.

According to FIG. 28, as illustrated in FIG. 27, the surface light source device 300 achieves having an entire surface, which is uniformly irradiated with light, of a light guide plate 120. This is illustrated as a brightness of a backlight in Fig, 28.

It should be noted here is that an example illustrated in FIG. 28 is an example case where the LED light source substrate 140*a* and the LED light source substrate 140*b* of the surface light source device 300 each emit light having a small luminance gradient on an edge of a range to be irradiated with light. Note that examples of configurations of respective LED packages 620*a* and LED packages 620*b* in this case will be later described.

According to the example illustrated in FIG. 28, (i) a luminance gradient in a location where the brightness of the light emitted from the LED light source substrate 140*a* changes and (ii) a luminance gradient in a location where the brightness of the light emitted from the LED light source substrate 140*b* changes are gentler at a boundary between the range 210*ca* and the range 210*b*, as compared with the example illustrated in FIG. 27. This is because edges of the range, to be irradiated with light, is irradiated with light, having a small luminance gradient, emitted from the LED light source substrate 140*a* and the LED light source substrate 140*b*, so that the edges of the respective ranges have respective brightnesses lower than those in parts, other than the edges, in the respective ranges.

In a case where neither the LED light source substrate 140*a* nor the LED light source substrate 140*b* has a displacement, a part where the brightness of the light emitted from the LED light source substrate 140*a* changes is exactly identical to a part where the brightness of the light emitted from the LED light source substrate 140*b* changes (see a graph illustrated in an upper part of FIG. 28). As a result, the backlight actually has a uniform brightness on the entire surface, which is irradiated with light, of the light guide plate 120.

On the other hand, in a case where the LED light source substrate 140*a* is arranged so as to have a downward displacement due to some reason, a part where the brightness of the light emitted from the LED light source substrate 140*a* changes is not identical to a part where the brightness of the light emitted from the LED light source substrate 140*b* changes (see a graph illustrated in a lower part of FIG. 28).

Note, however, that, as described above, (i) the luminance gradient in the position where the brightness of the light emitted from the LED light source substrate 140*a* changes and (ii) the luminance gradient in the position where the brightness of the light emitted from the LED light source substrate 140*b* changes are gentle at the boundary between the range 210*ca* and the range 210*b*. As a result, BM2, which is a part where the brightness of the light emitted from the backlight drops, occurs as a smaller drop in a wider range, as compared with the BM1. Since the BM2 occurs as a small drop in a wide range, the BM2 is less noticeable as unevenness of luminance. Accordingly, the BM2 has a small influence as a factor causing nonuniformity of the light, with which the surface, to be irradiated with light, of the light guide plate 120 is irradiated. The same applies to (i) a case where the LED light source substrate 140*a* is arranged so as to have a displacement other than the downward displacement and (ii) a case where the LED light source substrate 140*b* is arranged so as to have a displacement.

The following description will discuss arrangements of the respective LED light source substrate 140*a* and LED light source substrate 140*b* which are provided in order to realize the example illustrated in FIG. 28. For convenience, the following description will discuss only the LED light source substrate 140*a*. Note, however, that an arrangement similar to that of the LED light source substrate 140*a* is also applicable to the LED light source substrate 140*b*.

The LED light source substrate 140*a* is arranged so as to extend along a left side of the light guide plate 120 (the LED light source substrate 140*b* is arranged so as to extend along a right side of the light guide plate 120). It is preferable that light emitted from both ends of the LED light source substrate 140*a* has a luminance smaller than that of light emitted from a center part of the LED light source substrate 140*a*.

Note that such an arrangement can be specifically realized with the use of the following arrangements.

Figure 29:
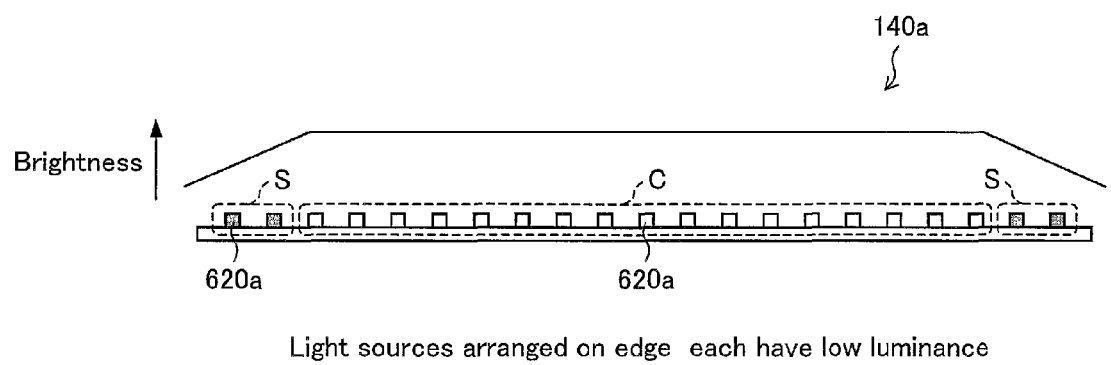
FIG. 29 is a view illustrating Example 1 of a configuration in which light emitted from each of both ends of an LED light source substrate has a luminance lower than that of light emitted from a center part of the LED light source substrate.

As Example 1, the LED light source substrate 140*a* is configured such that LED packages 620*a*, arranged in each of both ends S of the LED light source substrate 140*a*, each have a luminance lower than those of LED packages 620*a* arranged in a center part C of the LED light source substrate 140*a* (see FIG. 29).

Figure 30:
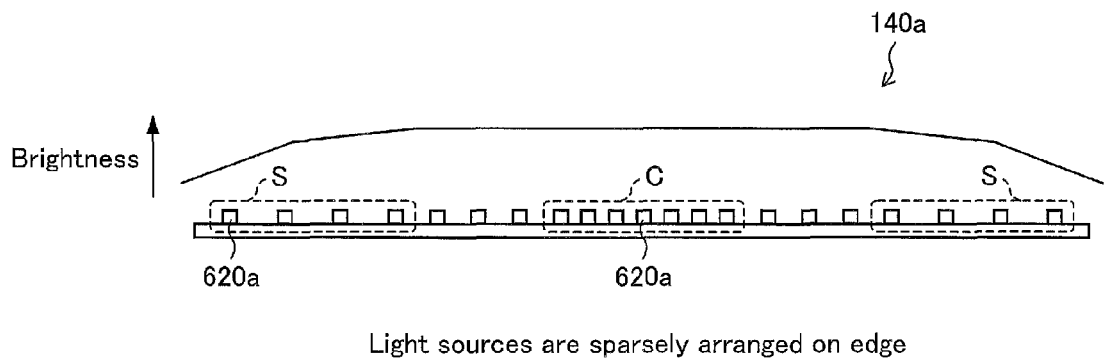
FIG. 30 is a view illustrating Example 2 of the configuration in which light emitted from each of both ends of an LED light source substrate has a luminance lower than that of light emitted from a center part of the LED light source substrate.

As Example 2, the LED light source substrate 140*a* is configured such that a plurality of LED packages 620*a*, arranged in each of both ends S of the LED light source substrate 140*a*, are arranged more sparsely than a plurality of LED packages 620*a* arranged in the center part C of the LED light source substrate 140*a* (see FIG. 30).

As Example 3, the LED light source substrate 140*a* is configured such that an electric current, which drives LED packages 620*a* arranged in each of both ends S of the LED light source substrate 140*a*, is smaller than an electric current which drives LED packages 620*a* arranged in the center part C of the LED light source substrate 140*a*.

As Example 4, the LED light source substrate 140*a* is configured such that first through third groups, each made up of a plurality of LED packages 620*a* which are connected to each other in parallel, are further provided so that (i) the first and third groups are connected to respective both ends S of the LED light source substrate 140*a* and (ii) the second group is connected to the center part C of the LED light source substrate 140*a*. In the configuration, the number of columns of the plurality of LED packages 620*a* in each of the first and third groups is greater than the number of columns of the plurality of LED packages 620*a* in the second group.

As Example 5, the LED light source substrate 140*a* is configured such that LED packages 620*a* of the LED light source substrate 140*a* are each driven by use of a PWM (Pulse Width Modulation). In the configuration, an electric current, which drives a plurality of LED packages 620*a* arranged in each of both ends S of the LED light source substrate 140*a*, has a duty ratio smaller than that of an electric current which drives a plurality of LED package 620*a* arranged in the center part C of the LED light source substrate 140*a*

In each of the Examples, it is preferable that light emitted from each of the both ends of the LED light source substrate 140*a* has a luminance lower by approximately 5% to 10% than a luminance of light emitted from the center part of the LED light source substrate 140*a*. In a case where the luminance is greatly changed all at once, a gap (a part where a change is distinctly steep) occurs in a luminance gradient of the LED packages 620*a* themselves, so as to cause unevenness of luminance. In a case where a luminance is sufficiently gently changed from the center part C towards the both ends S of the LED light source substrate 140*a*, it is possible to cause the light emitted from each of the both ends of the LED light source substrate 140*a* to have a luminance which is smaller by a maximum of approximately 30% than the luminance of light emitted from the center part of the LED light source substrate 140*a*.

The LED light source substrate 140*a* is preferably configured such that the light emitted from each of the both ends of the LED light source substrate 140*a* has a distribution characteristic which is different from that of light of emitted from a light source (hereinafter referred to as a reference light source) with which light an entire range, to be irradiated with light, is irradiated, the light having a substantially uniform luminance.

Note that such a configuration can be realized with the use of the following specific configurations.

Figure 31:
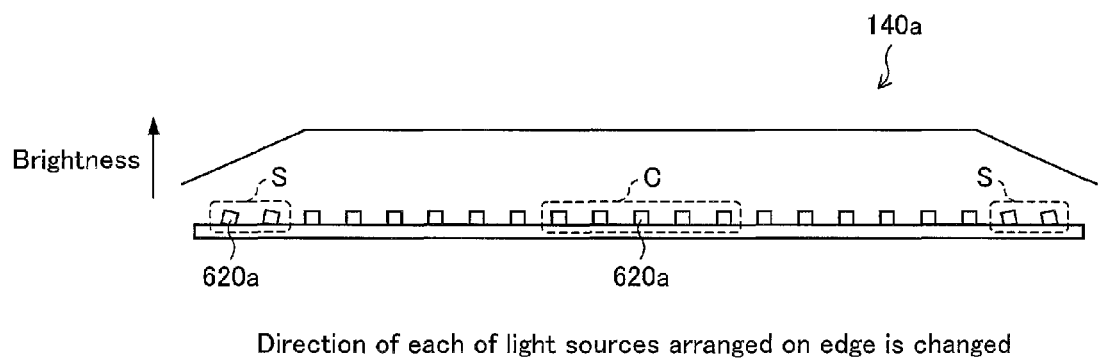
FIG. 31 is a view illustrating Example 1 of a configuration which differs, in a distribution characteristic of light emitted from each of both ends of an LED light source substrate, from a configuration of a light source which emits light having a substantially uniform luminance on an entire range which is irradiated with light.
Figure 32:
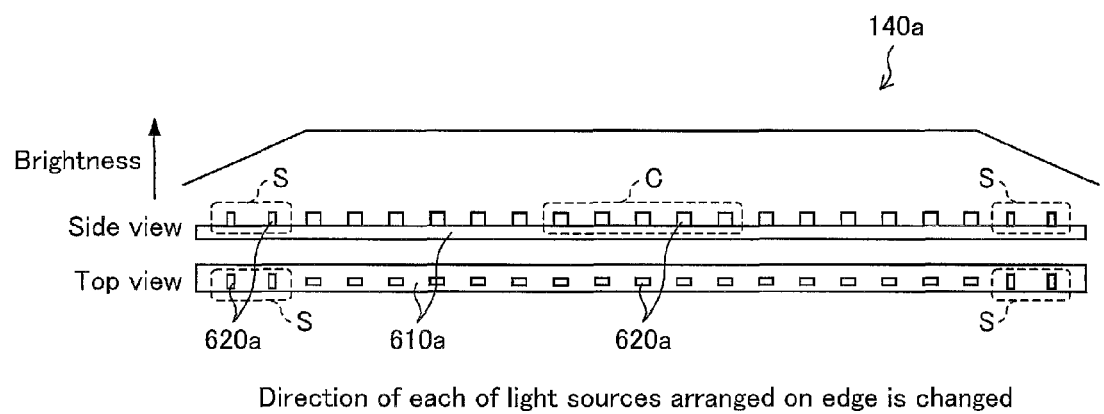
FIG. 32 is a view illustrating Example 1 of a configuration which differs, in a distribution characteristic of light emitted from each of both ends of an LED light source substrate, from a configuration of a light source which emits light having a substantially uniform luminance on an entire range which is irradiated with light.

As Example 1, the LED light source substrate 140*a* is configured such that a direction of at least one of LED packages 620*a* provided in each of both ends S of the LED light source substrate 140*a* differs from a direction of at least one of LED packages provided in each of both ends of the reference light source. Specifically, the at least one of the LED packages 620*a* provided in each of the both ends S of the LED light source substrate 140*a* can be provided to incline towards a side of a center part C or another side (see FIG. 31). Alternatively, the at least one of the LED packages 620*a* provided in each of the both ends S of the LED light source substrate 140*a* can be provided in a state where the at least one of the LED packages 620*a* is rotated in a direction parallel to a surface of a wiring substrate 610*a* (see FIG. 32).

As Example 2, the LED light source substrate 140*a* is configured such that at least one of LED packages 620*a* provided in each of both ends S of the LED light source substrate 140*a* is arranged in a height which is different from a height in which at least one of LED packages provided in each of both ends of the reference light source is arranged.

As Example 3, the LED light source substrate 140*a* is configured such that not all of LED packages 620*a* provided on the LED light source substrate 140*a* are identical in distribution characteristic.

Figure 33:
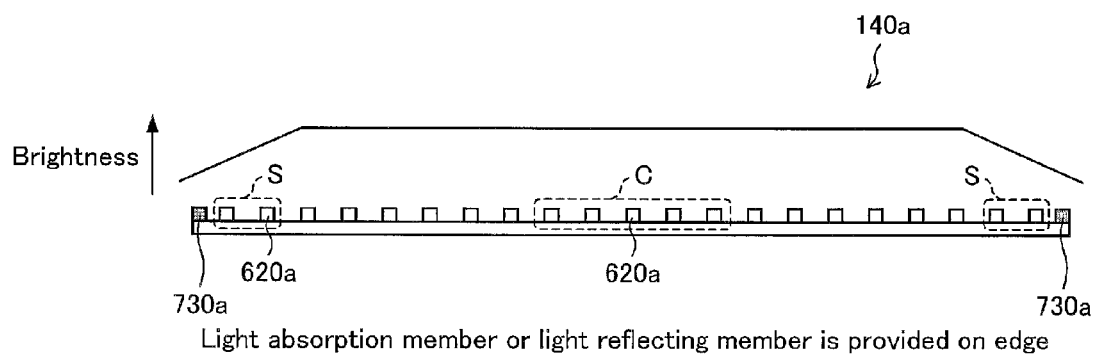
FIG. 33 is a view illustrating Example 4 of a configuration which differs, in a distribution characteristic of light emitted from each of both ends of an LED light source substrate, from a configuration of a light source which emits light having a substantially uniform luminance on an entire range which is irradiated with light.

As Example 4, the LED light source substrate 140*a* is configured to include light reflecting members (light reflecting sections) 730*a* each of which reflects light emitted from each of both ends S of the LED light source substrate 140*a* (see FIG. 33). Examples of materials of the light reflecting members 730*a* encompass a material having a total luminous reflectance of approximately 70% or more.

Figure 34:
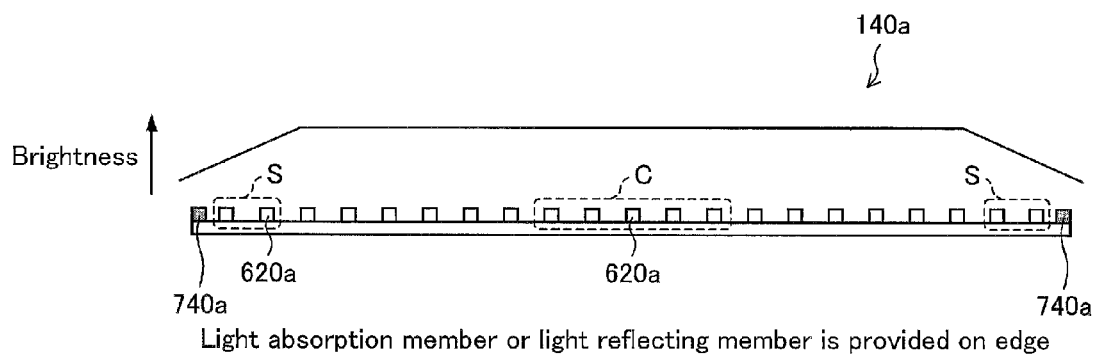
FIG. 34 is a view illustrating Example 5 of a configuration which differs, in a distribution characteristic of light emitted from each of both ends of an LED light source substrate, from a configuration of a light source which emits light having a substantially uniform luminance on an entire range which is irradiated with light.

As Example 5, the LED light source substrate 140*a* is configured to include light absorption members (light absorption sections) 740*a* each of which absorbs light emitted from each of both ends S of the LED light source substrate 140*a* (see FIG. 34).

Figure 35:
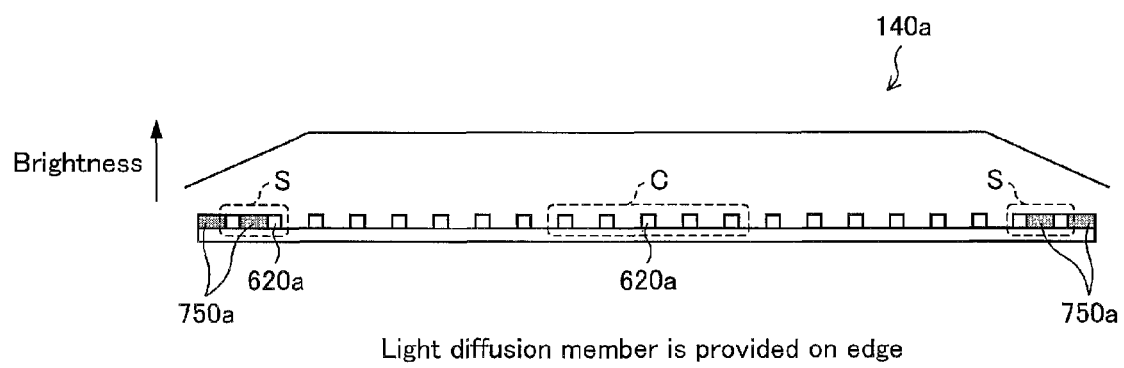
FIG. 35 is a view illustrating Example 6 of a configuration which differs, in a distribution characteristic of light emitted from each of both ends of an LED light source substrate, from a configuration of a light source which emits light having a substantially uniform luminance on an entire range which is irradiated with light.

As Example 6, the LED light source substrate 140*a* is configured to include light diffusion members (light diffusion sections) 750*a* each of which diffuses light emitted from each of both ends S of the LED light source substrate 140*a* (see FIG. 35). Examples of materials of the light diffusion members 750*a* encompass a material similar to that of the diffusing sheet 150.

Alternatively, the LED light source substrate 140*a* can be configured such that LED packages 620*a* are mounted on a lead frame by use of a wire-bonding system.

The LED light source substrate 140*a* can be configured such that LED packages 620*a* are mounted on a substrate by use of a wire-bonding system.

The LED light source substrate 140*a* can be configured such that LED packages 620*a* are mounted on a substrate by use of a connecting system in which a solder is employed.

The surface light source device 300 can be configured such that LED packages 620*a* are while LEDs (white light emitting diodes). Alternatively, the surface light source device 300 can be configured to include a plurality of LED packages 620*a* which are different from each other in luminescent color.

The LED light source substrate 140*a* preferably includes three or more such LED packages 620*a*.

Generally, a surface light source device 300 has a uniform luminance, which surface light source device 300 is an edge-light type surface light source device that employs an LED light source substrate 140*a* which has a length shorter than that of a corresponding one of sides of a light guide plate 120. In a case where a luminance gradient of light emitted from the LED light source substrate 140*a* is large on an edge of the light, unevenness of luminance easily occurs due to a displacement of the LED light source substrate 140*a*.

Accordingly, a luminance gradient is caused to be gentle in each of the both ends of the LED light source substrate 140*a* so that the LED light source substrate 140*a* emits light having a small luminance gradient on an edge of a range to be irradiated with light. Specifically, a luminance or a distribution characteristic of an end part S of the LED light source substrate 140*a* is changed.

The luminance can be changed as follows. That is, a plurality of LED packages 620*a* are sparsely arranged in each of the both ends S of the LED light source substrate 140*a*. Moreover, the LED light source substrate 140*a* is configured to separately include (i) a circuit which drives the LED packages 620*a* arranged in each of the both ends S of the LED light source substrate 140*a* and (ii) a circuit which drives the LED packages 620*a* arranged in the center part C of the LED light source substrate 140*a*. Only (i) an electric current which drives the LED packages 620*a* arranged in each of the both ends S of the LED light source substrate 140*a* or (ii) a duty ratio of such an electric current is reduced.

On the other hand, in order to change a distribution characteristic of light, the LED packages 620*a* arranged in each of the both ends S of the LED light source substrate 140*a* are inclined.

This makes it possible to reduce unevenness of luminance caused by an accuracy at which the surface light source device 300 has been assembled, so as to reduce a strictness with respect to a common difference.

The surface light source device 300 illustrated in FIG. 26 is configured by combining (i) a configuration of the surface light source device 30 and (ii) technical ideas of the application and the variation of the application. Note, however, that it is naturally possible to combine one of the surface light source devices 10, 50, and 70 and the technical ideas of the application and the variation of an application.

In a case where the LED light source substrate 140*a* is arranged near a center of a corresponding one of the sides of the light guide plate 120, a luminance gradient in each of the both ends S need to be gentle. In a case where the LED package 620*a* is arranged in an end of the corresponding one of the sides of the light guide plate 120, an effect can be brought about by causing a luminance gradient in an end part S (an end part which is farther from the end of the corresponding one of the sides of the light guide plate 120) to be gentle.

In order to reduce unevenness of luminance caused by a displacement between the LED light source substrate 140*a* and the light guide plate 120, measures need to be taken with respect to both of the LED light source substrate 140*a* and the light guide plate 120.

An edge-light type surface light source device of the present invention is preferably configured such that the at least one of the plurality of light sources includes three or more point light sources.

The edge-light type surface light source device of the present invention is preferably configured such that at least one of the plurality of light sources is provided to extend along a corresponding one of sides of the light guide section; and light emitted from at least one of end parts of the at least one of the plurality of light sources has a luminance smaller than a luminance of light emitted from a center part of the at least one of the plurality of light sources.

With the arrangement, it is possible to realize that the plurality of light sources each emit light having a small luminance gradient on an edge of a range to be irradiated with light. Note that such an arrangement can be specifically realized with the use of the following arrangements.

The edge-light type surface light source device of the present invention is configured such that the at least one of the plurality of light sources is provided such that a point light source of the three or more point light sources which is provided in the at least one of end parts has a luminance smaller than a luminance of a point light source of the three or more point light sources which is provided in the center part.

The edge-light type surface light source device of the present invention is configured such that the at least one of the plurality of light sources includes, as the three or more point light sources, a plurality of point light sources in each of (i) the at least one of the end parts and (ii) the center part; and the plurality of point light sources which are provided in the at least one of the end parts is more sparsely provided as compared with the plurality of point light sources which are provided in the center part.

The edge-light type surface light source device of the present invention is configured such that the at least one of the plurality of light sources is configured such that an electric current which drives a point light source of the three or more point light sources which is provided in the at least one of the end parts is smaller than an electric current which drives a point light source of the three or more point light sources which is provided in the center part.

The edge-light type surface light source device of the present invention is configured such that the at least one of the plurality of light sources includes, as the three or more point light sources, a plurality of point light sources in each of (i) the at least one of the end parts and (ii) the center part; and the number of columns of the plurality of point light sources which are provided in the at least one of the end parts is larger than the number of columns of the plurality of point light sources which are provided in the center part.

The edge-light type surface light source device of the present invention is configured such that (i) the three or more point light sources are each driven by use of a pulse width modulation and (ii) an electric current which drives a point light source of the three or more point light sources which is provided in the at least one of the end parts has a duty ratio smaller than a duty ratio of an electric current which drives a point light source of the three or more point light sources which is provided in the center part.

The edge-light type surface light source device of the present invention is preferably configured such that at least one of the plurality of light sources is provided to extend along a corresponding one of sides of the light guide section; and light emitted from at least one of end parts of the at least one of the plurality of light sources has a distribution characteristic which is different from a distribution characteristic of light emitted from a reference light source, which is a light source that emits light having a substantially uniform luminance on an entire range to be irradiated with light.

With the arrangement, it is possible to realize that the plurality of light sources each emit light having a small luminance gradient on an edge of a range to be irradiated with light. Note that such an arrangement can be specifically realized with the use of the following arrangements.

The edge-light type surface light source device of the present invention is configured such that the at least one of the plurality of light sources is configured such that a direction of at least one point light source of the three or more point light sources which is provided in the at least one of the end parts differs from a direction of at least one point light source which is provided in at least one of end parts of the reference light source.

The edge-light type surface light source device of the present invention is configured such that the at least one of the plurality of light sources is configured such that at least one of point light source of the three or more point light sources which is provided in the at least one of the end parts is provided in a height which is different from a height in which at least one point light source which is provided in at least one of end parts the reference light source is provided.

The edge-light type surface light source device of the present invention is configured such that not all of the three or more point light sources are identical in distribution characteristic.

The edge-light type surface light source device of the present invention is configured to further include: a light reflecting section which reflects light emitted from the at least one of the end parts.

The edge-light type surface light source device of the present invention is configured to further include: a light absorption section which absorbs light emitted from the at least one of the end parts.

The edge-light type surface light source device of the present invention is configured to further include: a light diffusion section which diffuses light emitted from the at least one of the end parts.

The edge-light type surface light source device of the present invention can be configured such that at least one of the plurality of light sources is configured such that the three or more point light sources are provided on a lead frame by use of a wire-bonding system.

The edge-light type surface light source device of the present invention can be configured such that the at least one of the plurality of light sources is configured such that the three or more point light sources are provided on a substrate by use of a wire-bonding system.

The edge-light type surface light source device of the present invention can be configured such that the at least one of the plurality of light sources is configured such that the three or more point light sources are provided on a substrate by use of a connecting system in which a solder is employed.

The edge-light type surface light source device of the present invention is preferably configured such that the three or more point light sources are light emitting diodes.

The edge-light type surface light source device of the present invention can be configured such that the light emitting diodes are white light emitting diodes.

The edge-light type surface light source device of the present invention can be configured to further include: a plurality of light emitting diodes which are different from each other in luminescent color.

The edge-light type surface light source device of the present invention is preferably configured such that on an entire surface, to be irradiated with light, of the light guide section, (i) a luminance distribution caused by light emitted from one of the plurality of light sources and (ii) a luminance distribution caused by light emitted from another one of the plurality of light sources have a relation in which their phases are opposite to each other.

The present invention is not limited to the description of the embodiments above, but may be altered by a skilled person in the art within the scope of the claims. An embodiment based on a proper combination of technical means disclosed in different embodiments is encompassed in the technical scope of the present invention.

Industrial Applicability

The present invention is applicable to an edge-light type surface light source device.

REFERENCE SIGNS LIST 10, 30, 50, 70, and 300: Surface light source device (edge-light type surface light source device)
140, 140a, 140b, 140c, 500, and 600: LED light source substrate (light source)
141: Small substrate
120: Light guide plate (light guide section)
121: Light guide body
122: Reflection pattern
130: Reflecting sheet
131: Reflecting member
132: Notched part of reflecting sheet
150: Diffusing sheet
160: Housing
601: Connector
610: Wiring substrate
611: Substrate
612: Wiring layer
613: Solder resist layer
620, 620a, and 620b: LED package (point light source, light emitting diode)
621: LED element
622: Sealing resin
623: Bonding wire
624: Wiring layer
625: Substrate
626: Solder
630: Reflecting sheet fixing member 511: Substrate
512: Connector
513: Wiring layer
514: Sealing resin
515: LED element
516: Bonding wire
730a: Light reflecting member (light reflecting section)
740a: Light absorption member (light absorption section)
750a: Light diffusion member (light diffusion section)
C: Center part
S: End part
S: Both ends

The invention claimed is:

1. An edge-light type surface light source device, comprising:
   a light guide section; and
   a plurality of light sources each of which emits light via a side surface of the light guide section toward the light guide section,
   the plurality of light sources being provided on a pair of sides of the light guide section which pair of sides face each other,
   a longest one of light emitting parts of the respective plurality of light sources having a length shorter than lengths of the respective pair of sides of the light guide section on which the plurality of light sources are provided,
   the plurality of light sources being each configured to emit light having a first luminance gradient on an edge of a range, to be irradiated with light, which first luminance gradient is smaller than a second luminance gradient of light having a substantially uniform luminance on an entire range to be irradiated with light,
   wherein $L+(N-1)y/\sqrt{(\lambda^2-1)} \geq x$ is satisfied, where
   (i) $\lambda$ indicates a refractive index of the light guide section,
   (ii) x indicates a length of each of the pair of sides of the light guide section,
   (iii) y indicates a length of a side of the light guide section, the side being neither one of the pair of sides of the light guide section,
   (iv) L indicates a sum total of the lengths of the respective plurality of light sources which are provided on the pair of sides each having the length x, and
   (v) N indicates the number of the plurality of light sources which are provided on the pair of sides each having the length x.

2. The edge-light type surface light source device as set forth in claim 1, wherein:
   at least one of the plurality of light sources is provided to extend along a corresponding one of sides of the light guide section; and
   light emitted from at least one of end parts of the at least one of the plurality of light sources has a luminance smaller than a luminance of light emitted from a center part of the at least one of the plurality of light sources.

3. The edge-light type surface light source device as set forth in claim 2, wherein the at least one of the plurality of light sources includes three or more point light sources.

4. The edge-light type surface light source device as set forth in claim 3, wherein the at least one of the plurality of light sources is provided such that a point light source of the three or more point light sources which is provided in the at least one of end parts has a luminance smaller than a luminance of a point light source of the three or more point light sources which is provided in the center part.

5. The edge-light type surface light source device as set forth in claim 3, wherein:
   the at least one of the plurality of light sources includes, as the three or more point light sources, a plurality of point light sources in each of (i) the at least one of the end parts and (ii) the center part; and
   the plurality of point light sources which are provided in the at least one of the end parts is more sparsely provided as compared with the plurality of point light sources which are provided in the center part.

6. The edge-light type surface light source device as set forth in claim 3, wherein the at least one of the plurality of light sources is configured such that an electric current which drives a point light source of the three or more point light sources which is provided in the at least one of the end parts is smaller than an electric current which drives a point light source of the three or more point light sources which is provided in the center part.

7. The edge-light type surface light source device as set forth in claim 3, wherein:
   the at least one of the plurality of light sources includes, as the three or more point light sources, a plurality of point light sources in each of (i) the at least one of the end parts and (ii) the center part; and
   the number of columns of the plurality of point light sources which are provided in the at least one of the end parts is larger than the number of columns of the plurality of point light sources which are provided in the center part.

8. The edge-light type surface light source device as set forth in claim 3, wherein the at least one of the plurality of light sources is configured such that (i) the three or more point light sources are each driven by use of a pulse width modulation and (ii) an electric current which drives a point light source of the three or more point light sources which is provided in the at least one of the end parts has a duty ratio smaller than a duty ratio of an electric current which drives a point light source of the three or more point light sources which is provided in the center part.

9. The edge-light type surface light source device as set forth in claim 1, wherein:
   at least one of the plurality of light sources is provided to extend along a corresponding one of sides of the light guide section; and
   light emitted from at least one of end parts of the at least one of the plurality of light sources has a distribution characteristic which is different from a distribution characteristic of light emitted from a reference light source, which is a light source that emits light having a substantially uniform luminance on an entire range to be irradiated with light.

10. The edge-light type surface light source device as set forth in claim 9, wherein the at least one of the plurality of light sources includes three or more point light sources.

11. The edge-light type surface light source device as set forth in claim 10, wherein the at least one of the plurality of light sources is configured such that a direction of at least one point light source of the three or more point light sources which is provided in the at least one of the end parts differs from a direction of at least one point light source which is provided in at least one of end parts of the reference light source.

12. The edge-light type surface light source device as set forth in claim 10, wherein the at least one of the plurality of light sources is configured such that at least one of point light source of the three or more point light sources which is provided in the at least one of the end parts is provided in a height which is different from a height in which at least one point light source which is provided in at least one of end parts the reference light source is provided.

13. An edge-light type surface light source device as set forth in claim 9, further comprising a light reflecting section which reflects light emitted from the at least one of the end parts.

14. An edge-light type surface light source device as set forth in claim 9, further comprising a light absorption section which absorbs light emitted from the at least one of the end parts.

15. An edge-light type surface light source device as set forth in claim 9, further comprising a light diffusion section which diffuses light emitted from the at least one of the end parts.

16. The edge-light type surface light source device as set forth in claim 3, wherein the at least one of the plurality of light sources is configured such that the three or more point light sources are provided on a substrate by use of a connecting system in which a solder is employed.

17. The edge-light type surface light source device as set forth in claim 3, wherein the three or more point light sources are light emitting diodes.

18. The edge-light type surface light source device as set forth in claim 17, wherein the light emitting diodes are white light emitting diodes.

19. An edge-light type surface light source device as set forth in claim 17, further comprising a plurality of light emitting diodes which are different from each other in luminescent color.

20. The edge-light type surface light source device as set forth in claim 1, wherein on an entire surface, to be irradiated with light, of the light guide section, (i) a luminance distribution caused by light emitted from one of the plurality of light sources and (ii) a luminance distribution caused by light emitted from another one of the plurality of light sources have a relation in which their phases are opposite to each other.

* * * * *